(12) United States Patent
Liao et al.

(10) Patent No.: US 12,352,932 B2
(45) Date of Patent: Jul. 8, 2025

(54) OPTICAL IMAGE CAPTURING SYSTEM, IMAGE CAPTURING DEVICE AND ELECTRONIC DEVICE

(71) Applicant: LARGAN PRECISION CO., LTD., Taichung (TW)

(72) Inventors: Lin-Yao Liao, Taichung (TW); Dung-Yi Hsieh, Taichung (TW); Wei-Yu Chen, Taichung (TW)

(73) Assignee: LARGAN PRECISION CO., LTD., Taichung (TW)

( * ) Notice: Subject to any disclaimer, the term of this patent is extended or adjusted under 35 U.S.C. 154(b) by 0 days.

(21) Appl. No.: 18/479,908

(22) Filed: Oct. 3, 2023

(65) Prior Publication Data
US 2024/0027738 A1 Jan. 25, 2024

Related U.S. Application Data

(63) Continuation of application No. 18/064,984, filed on Dec. 13, 2022, now Pat. No. 11,815,667, which is a (Continued)

(30) Foreign Application Priority Data

Jan. 30, 2015 (TW) ................................ 104103235

(51) Int. Cl.
*G02B 13/00* (2006.01)
*G02B 13/04* (2006.01)
(Continued)

(52) U.S. Cl.
CPC ........ *G02B 13/04* (2013.01); *H01J 37/32862* (2013.01); *H01L 21/02046* (2013.01);
(Continued)

(58) Field of Classification Search
CPC .. G02B 13/04; G02B 15/00–28; G02B 13/02; G02B 9/00–64;
(Continued)

(56) References Cited

U.S. PATENT DOCUMENTS 5,442,485 A 8/1995 Yamanashi
6,191,896 B1 2/2001 Itoh
(Continued)

FOREIGN PATENT DOCUMENTS

CN 102388331 A 3/2012
CN 104749748 A 7/2015
(Continued)

*Primary Examiner* — Henry Duong
(74) *Attorney, Agent, or Firm* — McClure, Qualey & Rodack, LLP

(57) ABSTRACT

An optical image capturing system comprising, in order from an object side to an image side, a first lens element, a second lens element, a third lens element, a fourth lens element, a fifth lens element, a sixth lens element and a seventh lens element. The first lens element with negative refractive power has a concave image-side surface. The second lens element, the third lens element and the fourth lens element have refractive power. The fifth lens element has refractive power. The sixth lens element with refractive power has an image-side surface being concave in a paraxial region and includes at least one convex shape in an off-axial region, wherein the surfaces thereof are aspheric. The seventh lens element with refractive power has an image-side surface being concave in a paraxial region and includes at least one convex shape in an off-axial region, wherein the surfaces thereof are aspheric.

7 Claims, 20 Drawing Sheets

Related U.S. Application Data continuation of application No. 16/926,869, filed on Jul. 13, 2020, now Pat. No. 11,555,987, which is a continuation of application No. 16/543,711, filed on Aug. 19, 2019, now Pat. No. 10,750,069, which is a continuation of application No. 15/927,304, filed on Mar. 21, 2018, now Pat. No. 10,432,835, which is a continuation of application No. 14/700,243, filed on Apr. 30, 2015, now Pat. No. 9,961,244.

(51) Int. Cl.
  *H01J 37/32* (2006.01)
  *H01L 21/02* (2006.01)
  *H01L 21/263* (2006.01)
  *H01L 21/3065* (2006.01)
  *H01L 21/311* (2006.01)

(52) U.S. Cl.
  CPC .... *H01L 21/02085* (2013.01); *H01L 21/2633* (2013.01); *H01L 21/3065* (2013.01); *H01L 21/31116* (2013.01)

(58) Field of Classification Search
  CPC ........ G02B 13/002–0045; G02B 13/18; G02B 3/04; H01J 37/32862; H01L 21/02046; H01L 21/02085; H01L 21/2633; H01L 21/3065; H01L 21/31116; G03B 5/00; G03B 17/17; G03B 30/00; G06V 10/147; G06V 30/1429; G06V 30/1437; G08B 13/19628; G08B 13/19626; H04N 13/282; H04N 23/58; H04N 5/2259; H04N 5/2254; G06K 9/209
  USPC ................ 348/335; 359/676–695, 745–795, 359/708–718
  See application file for complete search history.

(56) References Cited

U.S. PATENT DOCUMENTS

| | | | |
|---|---|---|---|
| 6,233,099 | B1 | 5/2001 | Itoh |
| 7,589,907 | B2 | 9/2009 | Yamamoto |
| 7,688,531 | B1 | 3/2010 | Deng et al. |
| 8,643,958 | B2 | 2/2014 | Abe et al. |
| 8,736,979 | B2 | 5/2014 | Tsai et al. |
| 8,780,464 | B2 | 7/2014 | Huang |
| 9,030,757 | B2 | 5/2015 | Kawamura |
| 9,547,155 | B2 | 1/2017 | Liao |
| 2009/0052053 | A1 | 2/2009 | Iyama |
| 2012/0044585 | A1 | 2/2012 | Yamamoto |
| 2012/0081799 | A1 | 4/2012 | Tseng et al. |
| 2013/0050846 | A1* | 2/2013 | Huang ............... G02B 13/0045 359/713 |
| 2015/0103414 | A1 | 4/2015 | Baik |
| 2016/0109687 | A1 | 4/2016 | Son |
| 2017/0160519 | A1 | 6/2017 | Katsuragi |

FOREIGN PATENT DOCUMENTS

| | | |
|---|---|---|
| JP | S62211611 A | 9/1987 |
| JP | H04218012 A | 8/1992 |
| JP | H07120672 A | 5/1995 |
| JP | 2005-156829 | 6/2005 |
| JP | 2009025801 A | 2/2009 |
| JP | 2012-002906 | 1/2012 |
| JP | 2014102291 A | 6/2014 |
| TW | 201310056 A | 3/2013 |
| WO | 2012/026069 A1 | 3/2012 |
| WO | 2012/026070 A1 | 3/2012 |
| WO | 2013/069264 A1 | 5/2013 |
| WO | 2014192567 A1 | 12/2014 |
| WO | 2016069418 A1 | 5/2016 |

* cited by examiner

OPTICAL IMAGE CAPTURING SYSTEM, IMAGE CAPTURING DEVICE AND ELECTRONIC DEVICE

RELATED APPLICATIONS

The present application is a continuation of the application Ser. No. 18/064,984, filed Dec. 13, 2022, U.S. Pat. No. 11,815,667 issued on Nov. 14, 2023, which is a continuation of the application Ser. No. 16/926,869, filed Jul. 13, 2020, U.S. Pat. No. 11,555,987 issued on Jan. 17, 2023, which is a continuation of the application Ser. No. 16/543,711, filed Aug. 19, 2019, U.S. Pat. No. 10,750,069 issued on Aug. 18, 2020, which is a continuation of the application Ser. No. 15/927,304, filed Mar. 21, 2018, U.S. Pat. No. 10,432,835 issued on Oct. 1, 2019, which is a continuation of the application Ser. No. 14/700,243, filed Apr. 30, 2015, U.S. Pat. No. 9,961,244 issued on May 1, 2018 which claims priority to Taiwan Application Serial Number 104103235, filed Jan. 30, 2015, which are herein incorporated by reference.

BACKGROUND

Technical Field

The present disclosure relates to an optical image capturing system and an image capturing device. More particularly, the present disclosure relates to a compact optical image capturing system and image capturing device applicable to electronic devices.

Description of Related Art

In recent years, with the popularity of mobile terminals having camera functionalities, the demand of miniaturized optical systems has been increasing. The sensor of a conventional optical system is typically a CCD (Charge-Coupled Device) or a CMOS (Complementary Metal-Oxide-Semiconductor) sensor. As the advanced semiconductor manufacturing technologies have allowed the pixel size of sensors to be reduced and compact optical systems have gradually evolved toward the field of higher megapixels, there is an increasing demand for compact optical systems featuring better image quality.

A conventional optical system employed in a portable electronic product mainly adopts a four-element lens structure or a five-element lens structure. Due to the popularity of mobile terminals with high-end specifications, such as smart phones, tablet personal computers and wearable apparatus, the requirements for high resolution and image quality of present compact optical systems increase significantly. However, the conventional optical systems cannot satisfy these requirements of the compact optical systems. Moreover, the conventional optical systems applied to the vehicle device cannot satisfy the demand of the image clarity with the lack of the resolving power.

Other conventional compact optical systems with six-element lens structure enhance image quality and resolution. However, the arrangement of the refractive power of the first lens element cannot moderate the incident light and cannot adjust a chief ray angle on the periphery of the image on an image surface. Therefore, the dim periphery of the image is resulted under the insufficient light source environment.

SUMMARY

According to one aspect of the present disclosure, an optical image capturing system comprising, in order from an object side to an image side, a first lens element, a second lens element, a third lens element, a fourth lens element, a fifth lens element, a sixth lens element and a seventh lens element. The first lens element with negative refractive power has an image-side surface being concave in a paraxial region thereof. The second lens element has refractive power. The third lens element has refractive power. The fourth lens element has refractive power. The fifth lens element has refractive power. The sixth lens element with refractive power has an image-side surface being concave in a paraxial region thereof and includes at least one convex shape in an off-axial region thereof, wherein an object-side surface and the image-side surface of the sixth lens element are aspheric. The seventh lens element with refractive power has an image-side surface being concave in a paraxial region thereof and includes at least one convex shape in an off-axial region thereof, wherein an object-side surface and the image-side surface of the seventh lens element are aspheric. The optical image capturing system has a total of seven lens elements with refractive power. There is no relative movement among the lens elements with refractive power. When a focal length of the optical image capturing system is f, a curvature radius of an object-side surface of the first lens element is R1, a curvature radius of the image-side surface of the sixth lens element is R12, a curvature radius of the image-side surface of the seventh lens element is R14, and a vertical distance between a non-axial critical point on the image-side surface of the sixth lens element and an optical axis is Yc62, the following conditions are satisfied:

$$|f/R1|<1.25;$$

$$0<R12/R14; \text{ and}$$

$$0.1<Yc62/f<1.0.$$

According to another aspect of the present disclosure, an image capturing device includes the optical image capturing system according to the aforementioned aspect and an image sensor, wherein the image sensor is disposed on an image surface of the optical image capturing system.

According to further another aspect of the present disclosure, an electronic device includes the image capturing device according to the aforementioned aspect.

DETAILED DESCRIPTION

Figure 1:
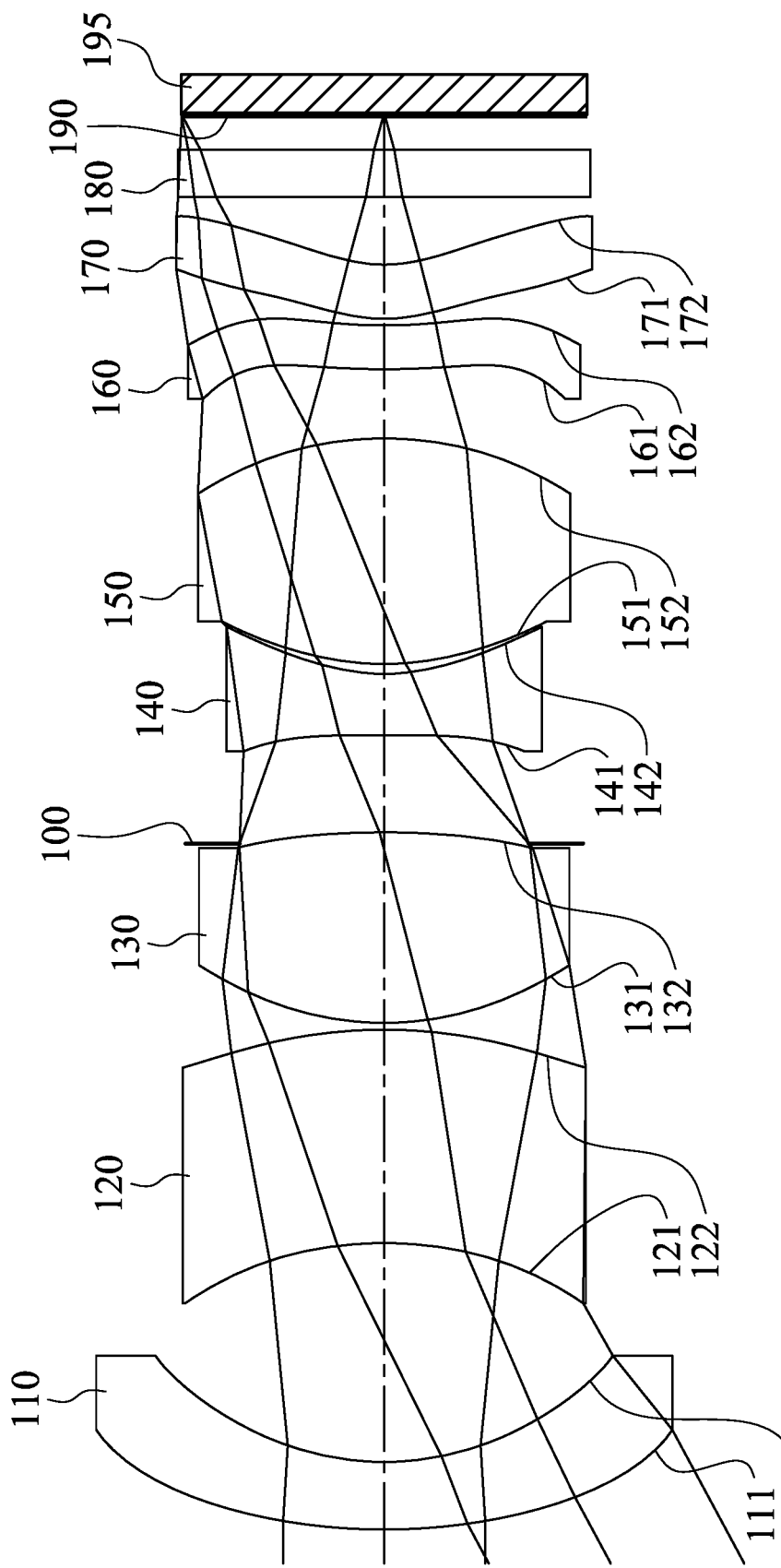
FIG. 1 is a schematic view of an image capturing device according to the 1st embodiment of the present disclosure.

An optical image capturing system includes, in order from an object side to an image side, a first lens element, a second lens element, a third lens element, a fourth lens element, a fifth lens element, a sixth lens element and a seventh lens element. The optical image capturing system has a total of seven lens elements with refractive power, and there is no relative movement among the lens elements with refractive power.

The first lens element with negative refractive power has an image-side surface being concave in a paraxial region thereof. Therefore, the incident light can be moderated for adjusting a chief ray angle on the periphery of the image an image surface, so that it is favorable for avoiding the dim periphery of the image under the insufficient light source environment.

The second lens element can have positive refractive power, so that the main positive refractive power can be provided for reducing the total track length of the optical image capturing system.

The third lens element can have positive refractive power, so that the total track length of the optical image capturing system can be reduced for maintaining the compact size thereof.

The fourth lens element can have negative refractive power, so that the aberration of the optical image capturing system can be corrected.

The fifth lens element can have positive refractive power, so that the manufacture sensitivity of the optical image capturing system can be reduced. Furthermore, the fifth lens element can be cemented to the fourth lens element, so that the manufacturability and environmental resistance thereof can be further enhanced.

The sixth lens element has an image-side surface being concave in a paraxial region thereof and includes at least one convex shape in an off-axial region thereof. Therefore, it is favorable for reducing the incident angle of the off-axis field onto the image sensor so as to increase the responding efficiency of the image sensor.

The seventh lens element can have an object-side surface being convex in a paraxial region thereof and include at least one concave shape in an off-axial region thereof, and has an image-side surface being concave in a paraxial region thereof and includes at least one convex shape in an off-axial region thereof. Therefore, it is favorable for improving the image quality on the periphery thereof as well as the relative illumination, and further reducing the manufacture sensitivity.

When a focal length of the optical image capturing system is f, and a curvature radius of an object-side surface of the first lens element is R1, the following condition is satisfied: $|f/R1|<1.25$. Therefore, it is favorable for avoiding the excessive curvature of the object-side surface of the first lens element and the aberration generated by the incident light, and also favorable for the manufacture of the first lens element. Preferably, the following condition can be satisfied: $|f/R1|<1.0$.

When a curvature radius of the image-side surface of the sixth lens element is R12, and a curvature radius of the image-side surface of the seventh lens element is R14, the following condition is satisfied: $0<R12/R14$. Therefore, it is favorable for reducing the manufacture sensitivity by the arrangement of the curvature radius of the image-side surface of the sixth lens element and the seventh lens element.

When the focal length of the optical image capturing system, a vertical distance between a non-axial critical point on the image-side surface of the sixth lens element and an optical axis is Yc62, and the following conditions are satisfied: $0.1<Yc62/f<1.0$. Therefore, it is favorable for enhancing the sensitivity of the image sensor by reducing the incident angle of the off-axis field onto the image sensor.

When half of a maximal field of view of the optical image capturing system is HFOV, the following condition is satisfied: HFOV<35 degrees. Therefore, it is favorable for avoiding the stray light by the proper field of view and the imaging range.

When the focal length of the optical image capturing system is f, and the curvature radius of the image-side surface of the seventh lens element is R14, the following condition is satisfied: $1.5<f/R14$. Therefore, the manufacture sensitivity can be reduced effectively.

When the focal length of the optical image capturing system is f, a focal length of the sixth lens element is f6, and a focal length of the seventh lens element is f7, the following condition is satisfied: $|f/f6|+|f/f7|<0.75$. Therefore, it is favorable for reducing the manufacture sensitivity. Preferably, the following condition can be satisfied: $|f/f6|+|f/f7|<0.55$.

When a central thickness of the sixth lens element is CT6, a central thickness of the seventh lens element is CT7, and an axial distance between the sixth lens element and the seventh lens element is T67, the following condition is satisfied: $1.75<(CT6+CT7)/T67$. Therefore, it is favorable for the manufacture and assembling of the lens elements.

When an f-number of the optical image capturing system is Fno, the following condition is satisfied: Fno<2.0. Therefore, it is favorable for capturing images in a low light environment with a large aperture.

When a composite focal length of the fourth lens element and the fifth lens element is f45, the following condition is satisfied: $0<f45$. Therefore, the manufacture sensitivity of the optical image capturing system can be reduced.

When a sum of central thicknesses of the first lens element, the second lens element, the third lens element, the fourth lens element, the fifth lens element, the sixth lens element and the seventh lens element is ΣCT, and an axial distance between the object-side surface of the first lens element and the image-side surface of the seventh lens element is Td, the following condition is satisfied: 0.55<ΣCT/Td<0.80. Therefore, the total track length of the optical image capturing system can be reduced so as to maintain the compact size thereof.

When a maximum effective radius of the object-side surface and the image-side surface of the first lens element, the second lens element, the third lens element, the fourth lens element, the fifth lens element, the sixth lens element and the seventh lens element is SDmax, and a minimum effective radius of the object-side surface and the image-side surface of the first lens element, the second lens element, the third lens element, the fourth lens element, the fifth lens element, the sixth lens element and the seventh lens element is SDmin, the following condition is satisfied: SDmax/SDmin<2.25. Therefore, the angle of the incident light or the exiting light on each surface of the lens elements can be moderated for reducing the generation of the stray light, so that the image quality can be enhanced, and the lens assembling would be easier due to similar radius values of each lens element.

When an axial distance between the second lens element and the third lens element is T23, and a central thickness of the second lens element is CT2, the following condition is satisfied: T23/CT2<0.50. Therefore, it is favorable for the manufacture and assembling of the lens elements.

When a chief ray angle of a maximum image height on the image surface of the optical image capturing system is CRA(Ymax), the following condition is satisfied: CRA(Ymax)<15 degrees. Therefore, it is favorable for effectively controlling the incident angle of the off-axis field onto the image sensor so as to increase the responding efficiency of the image sensor, and enhance the image quality.

The optical image capturing system can further includes a stop, such as an aperture stop. When a composite focal length of the lens elements with refractive power disposed between an object and the stop is ff, and a composite focal length of the lens elements with refractive power disposed between the stop and an image surface is fr, the following condition is satisfied: 3.0<|ff/fr|. Therefore, it is favorable for correcting the aberration and the distortion with the large aperture property while properly arranging the lens elements with refractive power on two sides of the stop.

According to the optical image capturing system of the present disclosure, the lens elements thereof can be made of glass or plastic material. When the lens elements are made of glass material, the distribution of the refractive powers of the optical image capturing system may be more flexible to design. When the lens elements are made of plastic material, the manufacturing cost can be effectively reduced. Furthermore, surfaces of each lens element can be arranged to be aspheric, since the aspheric surface of the lens element is easy to form a shape other than spherical surface so as to have more controllable variables for eliminating the aberration thereof, and to further decrease the required number of the lens elements. Therefore, the total track length of the optical image capturing system can also be reduced.

According to the optical image capturing system of the present disclosure, each of an object-side surface and an image-side surface has a paraxial region and an off-axis region. The paraxial region refers to the region of the surface where light rays travel close to the optical axis, and the off-axis region refers to the region of the surface away from the paraxial region. Particularly, when the lens element has a convex surface, it indicates that the surface is convex in the paraxial region thereof; when the lens element has a concave surface, it indicates that the surface is concave in the paraxial region thereof.

According to the optical image capturing system of the present disclosure, the positive refractive power or the negative refractive power of a lens element or the focal length of the lens element, that is, refers to the refractive power or the focal length in a paraxial region of the lens element.

According to the optical image capturing system of the present disclosure, a non-axial point is a critical point of the lens surface where its tangent is perpendicular to an optical axis.

According to the optical image capturing system of the present disclosure, the optical image capturing system can include at least one stop, such as an aperture stop, a glare stop or a field stop. Said glare stop or said field stop is for eliminating the stray light and thereby improving the image resolution thereof.

According to the optical image capturing system of the present disclosure, an image surface of the optical image capturing system, based on the corresponding image sensor, can be flat or curved. In particular, the image surface can be a curved surface being concave facing towards the object side.

According to the optical image capturing system of the present disclosure, an aperture stop can be configured as a front stop or a middle stop. A front stop disposed between an object and the first lens element can provide a longer distance between an exit pupil of the optical image capturing system and the image surface and thereby improves the image-sensing efficiency of an image sensor. A middle stop disposed between the first lens element and the image surface is favorable for enlarging the field of view of the optical image capturing system and thereby provides a wider field of view for the same.

According to the optical image capturing system of the present disclosure, the optical image capturing system can be applied to 3D (three-dimensional) image capturing applications, in products such as digital cameras, mobile devices, digital tablets, smart TV, internet monitoring device, motion sensing input device, vehicle device (such as driving recording systems, vehicle reversing displays), rear view camera systems, and wearable devices.

According to the present disclosure, an image capturing device is provided. The image capturing device includes the aforementioned optical image capturing system and an image sensor, wherein the image sensor is disposed on the image side of the aforementioned optical image capturing system, that is, the image sensor can be disposed on or near an image surface of the aforementioned optical image capturing system. In the image capturing device, by the arrangement of the negative refractive power of the first lens element, the incident light can be moderated for adjusting a chief ray angle on the periphery of the image on the image surface, so that it is favorable for avoiding the dim periphery of the image under the insufficient light source environment. Furthermore, the surface shape of the sixth lens element and the seventh lens element can improve the image quality and the relative illumination, and can further decrease the manufacture sensitivity. Preferably, the image capturing device can further include a barrel member, a holding member or a combination thereof.

According to the present disclosure, an electronic device is provided. The electronic device includes the aforementioned image capturing device. Therefore, the image quality of the electronic device can be increased. Preferably, the electronic device can further include but not limited to a control unit, a display, a storage unit, a random access memory unit (RAM), a read only memory unit (ROM) or a combination thereof.

According to the above description of the present disclosure, the following 1st-11th specific embodiments are provided for further explanation.

1st Embodiment

Figure 2:
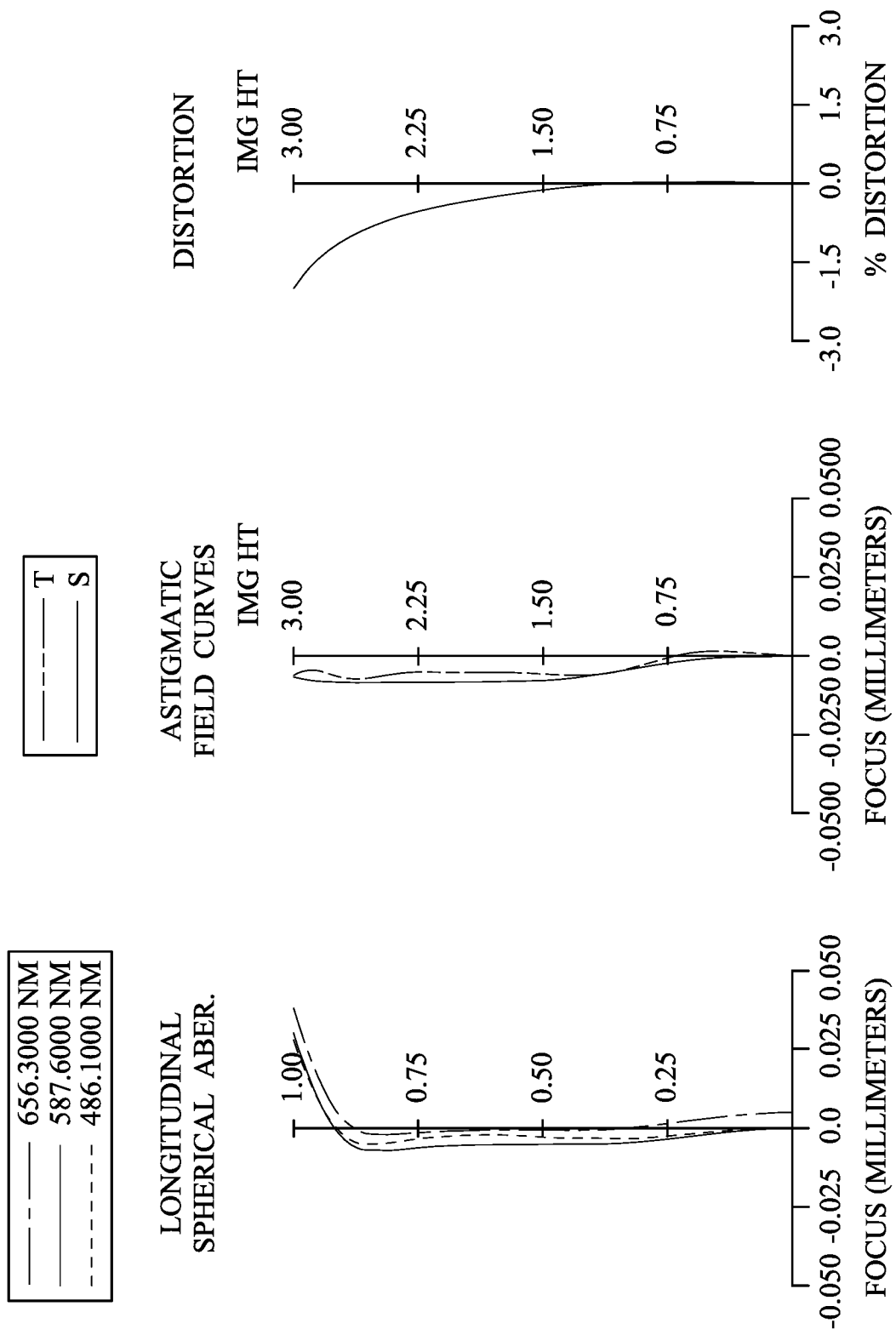
FIG. 2 shows spherical aberration curves, astigmatic field curves and a distortion curve of the image capturing device according to the 1st embodiment.

FIG. 1 is a schematic view of an image capturing device according to the 1st embodiment of the present disclosure. FIG. 2 shows spherical aberration curves, astigmatic field curves and a distortion curve of the image capturing device according to the 1st embodiment. In FIG. 1, the image capturing device includes an optical image capturing system (its reference numeral is omitted) and an image sensor 195. The optical image capturing system includes, in order from an object side to an image side, a first lens element 110, a second lens element 120, a third lens element 130, an aperture stop 100, a fourth lens element 140, a fifth lens element 150, a sixth lens element 160, a seventh lens element 170, an IR-cut filter 180 and an image surface 190, wherein the image sensor 195 is disposed on the image surface 190 of the optical image capturing system. The optical image capturing system has a total of seventh lens elements (110-170) with refractive power. There is no relative movement among the lens elements (110-170) with refractive power.

The first lens element 110 with negative refractive power has an object-side surface 111 being convex in a paraxial region thereof and an image-side surface 112 being concave in a paraxial region thereof. The first lens element 110 is made of plastic material, and has the object-side surface 111 and the image-side surface 112 being both aspheric.

The second lens element 120 with negative refractive power has an object-side surface 121 being concave in a paraxial region thereof and an image-side surface 122 being convex in a paraxial region thereof. The second lens element 120 is made of plastic material, and has the object-side surface 121 and the image-side surface 122 being both aspheric.

The third lens element 130 with positive refractive power has an object-side surface 131 being convex in a paraxial region thereof and an image-side surface 132 being convex in a paraxial region thereof. The third lens element 130 is made of plastic material, and has the object-side surface 131 and the image-side surface 132 being both aspheric.

The fourth lens element 140 with negative refractive power has an object-side surface 141 being convex in a paraxial region thereof and an image-side surface 142 being concave in a paraxial region thereof. The fourth lens element 140 is made of plastic material, and has the object-side surface 141 and the image-side surface 142 being both aspheric.

The fifth lens element 150 with positive refractive power has an object-side surface 151 being convex in a paraxial region thereof and an image-side surface 152 being convex in a paraxial region thereof. The fifth lens element 150 is made of plastic material, and has the object-side surface 151 and the image-side surface 152 being both aspheric.

The sixth lens element 160 with negative refractive power has an object-side surface 161 being convex in a paraxial region thereof, and an image-side surface 162 being concave in a paraxial region thereof and including at least one convex shape in an off-axial region thereof. The sixth lens element 160 is made of plastic material, and has the object-side surface 161 and the image-side surface 162 being both aspheric.

The seventh lens element 170 with negative refractive power has an object-side surface 171 being convex in a paraxial region thereof and including at least one concave shape in an off-axial region thereof, and an image-side surface 172 being concave in a paraxial region thereof and including at least one convex shape in an off-axial region thereof. The seventh lens element 170 is made of plastic material, and has the object-side surface 171 and the image-side surface 172 being both aspheric.

The IR-cut filter 180 is made of glass material and located between the seventh lens element 170 and the image surface 190, and will not affect a focal length of the optical image capturing system.

The equation of the aspheric surface profiles of the aforementioned lens elements of the 1st embodiment is expressed as follows:

$$X(Y) = (Y^2/R)/(1 + sqrt(1 - (1+k) \times (Y/R)^2)) + \sum_{i}(Ai) \times (Y^i),$$

where,

X is the relative distance between a point on the aspheric surface spaced at a distance Y from the optical axis and the tangential plane at the aspheric surface vertex on the optical axis;

Y is the vertical distance from the point on the aspheric surface to the optical axis;

R is the curvature radius;

k is the conic coefficient; and

Ai is the i-th aspheric coefficient.

In the optical image capturing system according to the 1st embodiment, when a focal length of the optical image capturing system is f, an f-number of the optical image capturing system is Fno, and half of a maximal field of view of the optical image capturing system is HFOV, these parameters have the following values: f=5.68 mm; Fno=1.90; and HFOV=28.3 degrees.

In the optical image capturing system according to the 1st embodiment, when a chief ray angle of a maximum image height on the image surface 190 of the optical image capturing system is CRA(Ymax), the following condition is satisfied: CRA(Ymax)=11.09 degrees.

In the optical image capturing system according to the 1st embodiment, when an axial distance between the second lens element 120 and the third lens element 130 is T23, and a central thickness of the second lens element 120 is CT2, the following condition is satisfied: T23/CT2=0.03.

In the optical image capturing system according to the 1st embodiment, when a central thickness of the sixth lens element 160 is CT6, a central thickness of the seventh lens element 170 is CT7, and an axial distance between the sixth lens element 160 and the seventh lens element 170 is T67, the following condition is satisfied: (CT6+CT7)/T67=14.63.

In the optical image capturing system according to the 1st embodiment, when a central thickness of the first lens element 110 is CT1, the central thickness of the second lens element 120 is CT2, a central thickness of the third lens element 130 is CT3, a central thickness of the fourth lens element 140 is CT4, a central thickness of the fifth lens element 150 is CT5, the central thickness of the sixth lens element 160 is CT6, the central thickness of the seventh lens element 170 is CT7, a sum of central thicknesses of the first lens element 110, the second lens element 120, the third lens element 130, the fourth lens element 140, the fifth lens element 150, the sixth lens element 160 and the seventh lens element 170 is ΣCT (ΣCT=CT1+CT2+CT3+CT4+CT5+CT6+CT7), and an axial distance between the object-side surface 111 of the first lens element 110 and the image-side surface 172 of the seventh lens element 170 is Td, the following condition is satisfied: ΣCT/Td=0.68.

Figure 15:
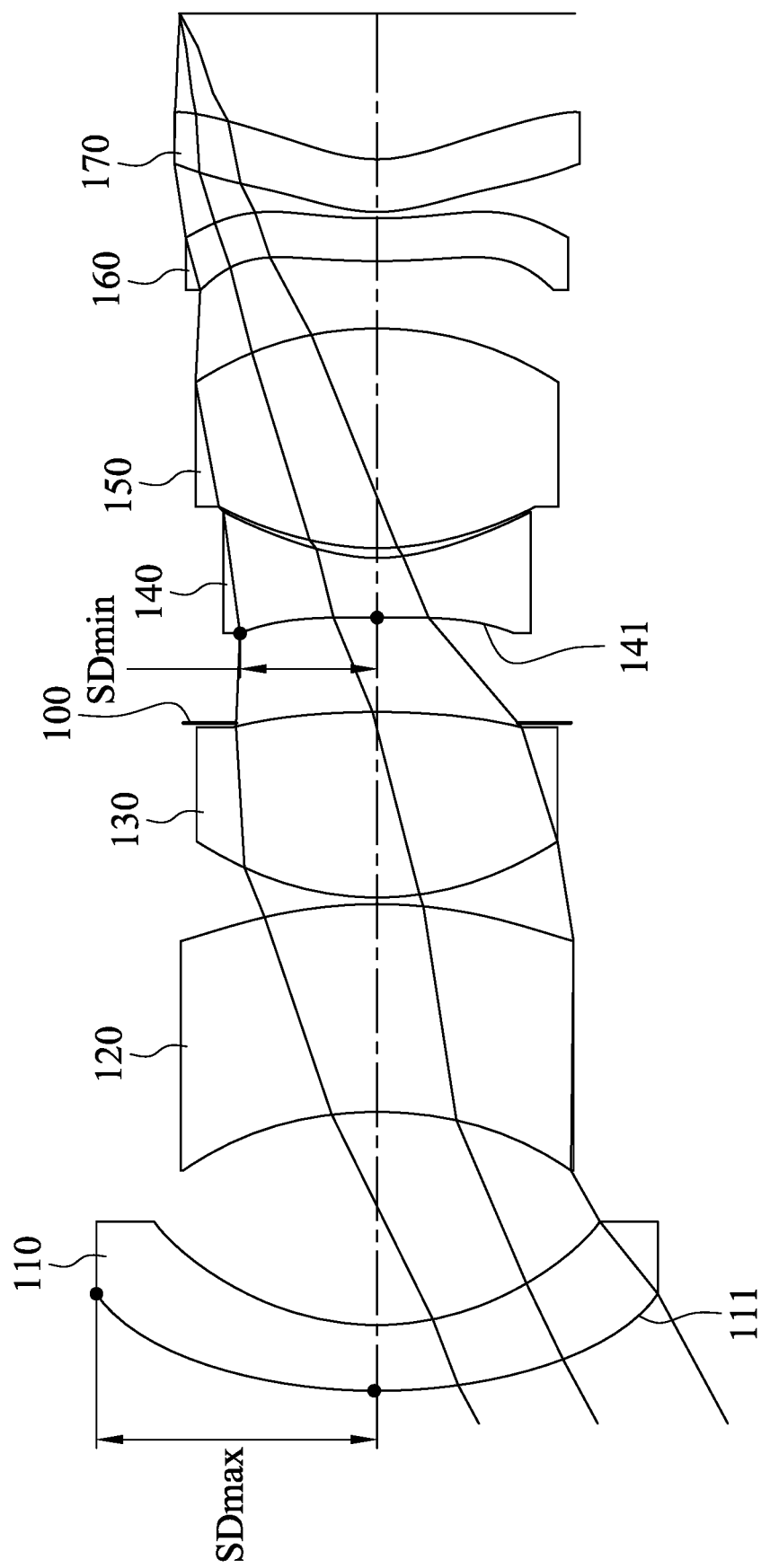
FIG. 15 shows a schematic view of the parameters SDmax and SDmin according to the 1st embodiment of FIG. 1.

FIG. 15 shows a schematic view of the parameters SDmax and SDmin according to the 1st embodiment of FIG. 1. In FIG. 15, when a maximum effective radius of the object-side surface and the image-side surface of the first lens element 110, the second lens element 120, the third lens element 130, the fourth lens element 140, the fifth lens element 150, the sixth lens element 160 and the seventh lens element 170 is SDmax (in the 1st embodiment, SDmax is the effective radius of the object-side surface 111 of the first lens element 110), and a minimum effective radius of the object-side surface and the image-side surface of the first lens element 110, the second lens element 120, the third lens element 130, the fourth lens element 140, the fifth lens element 150, the sixth lens element 160 and the seventh lens element 170 is SDmin (in the 1st embodiment, SDmin is the effective radius of the object-side surface 141 of the fourth lens element 140), the following condition is satisfied: SDmax/SDmin=2.05.

In the optical image capturing system according to the 1st embodiment, when a curvature radius of the image-side surface 162 of the sixth lens element 160 is R12, and a curvature radius of the image-side surface 172 of the seventh lens element 170 is R14, the following condition is satisfied: R12/R14=3.88.

In the optical image capturing system according to the 1st embodiment, when the focal length of the optical image capturing system is f, and a curvature radius of the object-side surface 111 of the first lens element 110 is R1, the following conditions are satisfied: |f/R1|=0.62.

In the optical image capturing system according to the 1st embodiment, when the focal length of the optical image capturing system is f, and the curvature radius of the image-side surface 172 of the seventh lens element 170 is R14, the following condition is satisfied: f/R14=2.62.

Figure 16:
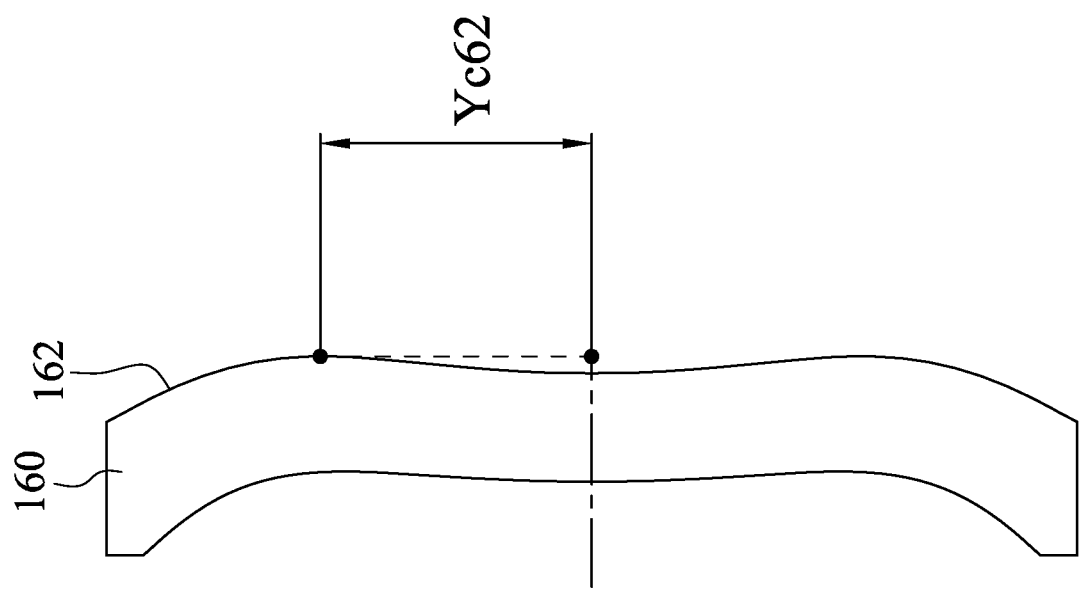
FIG. 16 shows a schematic view of the parameter Yc62 according to the 1st embodiment of FIG. 1.

FIG. 16 shows a schematic view of the parameter Yc62 according to the 1st embodiment of FIG. 1. In FIG. 16, a vertical distance between a non-axial critical point on the image-side surface 162 of the sixth lens element 160 and an optical axis is Yc62, and the focal length of the optical image capturing system is f, the following condition is satisfied: Yc62/f=0.28.

In the optical image capturing system according to the 1st embodiment, when the focal length of the optical image capturing system is f, a focal length of the sixth lens element 160 is f6, and a focal length of the seventh lens element 170 is f7, the following condition is satisfied: |f/f6|+|f/f7|=0.18.

In the optical image capturing system according to the 1st embodiment, when a composite focal length of the fourth lens element 140 and the fifth lens element 150 is f45, the following condition is satisfied: f45=28.50.

In the optical image capturing system according to the 1st embodiment, when a composite focal length of the lens elements with refractive power disposed between an object and the aperture stop 100 is ff (in the 1st embodiment, ff is a composite focal length of the first lens element 110, the second lens element 120 and the third lens element 130), a composite focal length of the lens elements with refractive power disposed between the aperture stop 100 and the image surface 190 is fr (in the 1st embodiment, fr is a composite focal length of the fourth lens element 140, the fifth lens element 150, the sixth lens element 160 and the seventh lens element 170), and the following condition is satisfied: |ff/fr|=0.001.

The detailed optical data of the 1st embodiment are shown in Table 1 and the aspheric surface data are shown in Table 2 below.

TABLE 1

1st Embodiment
f = 5.68 mm, Fno = 1.90, HFOV = 28.3 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Lens 1 | 9.181 | ASP | 1.000 | Plastic | 1.544 | 55.9 | −15.68 |
| 2 | | 4.252 | ASP | 3.238 | | | | |
| 3 | Lens 2 | −5.920 | ASP | 3.159 | Plastic | 1.614 | 25.6 | −431.21 |
| 4 | | −7.284 | ASP | 0.100 | | | | |
| 5 | Lens 3 | 4.626 | ASP | 2.820 | Plastic | 1.544 | 55.9 | 6.66 |
| 6 | | −13.179 | ASP | −0.167 | | | | |
| 7 | Ape. Stop | Plano | | 1.602 | | | | |
| 8 | Lens 4 | 98.781 | ASP | 0.906 | Plastic | 1.633 | 23.4 | −4.51 |
| 9 | | 2.763 | ASP | 0.149 | | | | |
| 10 | Lens 5 | 4.151 | ASP | 3.338 | Plastic | 1.544 | 55.9 | 4.93 |
| 11 | | −5.431 | ASP | 1.026 | | | | |
| 12 | Lens 6 | 14.226 | ASP | 0.648 | Plastic | 1.583 | 30.2 | −36.79 |
| 13 | | 8.412 | ASP | 0.099 | | | | |
| 14 | Lens 7 | 2.486 | ASP | 0.800 | Plastic | 1.544 | 55.9 | −265.92 |
| 15 | | 2.166 | ASP | 1.000 | | | | |
| 16 | IR-cut filter | Plano | | 0.700 | Glass | 1.517 | 64.2 | — |
| 17 | | Plano | | 0.514 | | | | |
| 18 | Image | Plano | | — | | | | |

Note:
Reference wavelength is 587.6 nm (d-line).

TABLE 2

Aspheric Coefficients

| Surface # | 1 | 2 | 3 | 4 | 5 |
|---|---|---|---|---|---|
| k= | 3.1807E+00 | 3.4043E−01 | 1.9882E+00 | −3.8900E−01 | −5.3114E−01 |
| A4= | −1.1925E−04 | −1.1956E−03 | −2.4128E−04 | 9.0080E−05 | 3.2520E−04 |
| A6= | 1.8817E−06 | −4.9516E−05 | 2.5768E−05 | 4.5084E−05 | −3.1269E−06 |
| A8= | −1.1255E−06 | −8.9391E−06 | −2.0904E−06 | 3.8405E−07 | 4.0507E−06 |
| A10= | 6.2530E−08 | 8.4241E−08 | 1.8724E−06 | 3.7898E−07 | −9.9590E−07 |

| Surface # | 6 | 8 | 9 | 10 | 11 |
|---|---|---|---|---|---|
| k= | 3.5918E+00 | −9.0000E+01 | −4.1064E+00 | −2.0075E+00 | −1.7158E+00 |
| A4= | −2.2266E−03 | −2.1035E−02 | −4.1968E−03 | −2.0423E−03 | −4.4866E−03 |
| A6= | 1.4038E−04 | 2.8761E−03 | 9.4233E−04 | −1.2719E−04 | 4.6202E−04 |
| A8= | −2.3596E−05 | −3.7269E−04 | 4.0039E−06 | 1.5599E−04 | −4.1116E−05 |
| A10= | 1.2905E−06 | 1.9480E−05 | −6.7336E−06 | −1.4820E−05 | 1.7036E−06 |

| Surface # | 12 | 13 | 14 | 15 |
|---|---|---|---|---|
| k= | 2.5106E+01 | 6.5392E+00 | −2.3882E+00 | −8.7887E−01 |
| A4= | 8.2483E−03 | 5.6805E−03 | −2.5717E−02 | −4.6985E−02 |
| A6= | −8.8326E−03 | −1.0348E−02 | 9.0312E−04 | 7.1837E−03 |
| A8= | 1.7317E−03 | 2.3252E−03 | 7.6099E−04 | −7.7392E−04 |
| A10= | −2.5251E−04 | −2.9070E−04 | −1.3790E−04 | 5.5476E−05 |
| A12= | 2.2279E−05 | 2.0122E−05 | 9.9800E−06 | −2.5375E−06 |
| A14= | −8.4111E−07 | −6.0944E−07 | −2.8130E−07 | 4.6489E−08 |

In Table 1, the curvature radius, the thickness and the focal length are shown in millimeters (mm). Surface numbers 0-18 represent the surfaces sequentially arranged from the object-side to the image-side along the optical axis. In Table 2, k represents the conic coefficient of the equation of the aspheric surface profiles. A4-A14 represent the aspheric coefficients ranging from the 4th order to the 14th order. The tables presented below for each embodiment are the corresponding schematic parameter and aberration curves, and the definitions of the tables are the same as Table 1 and Table 2 of the 1st embodiment. Therefore, an explanation in this regard will not be provided again.

2nd Embodiment

Figure 3:
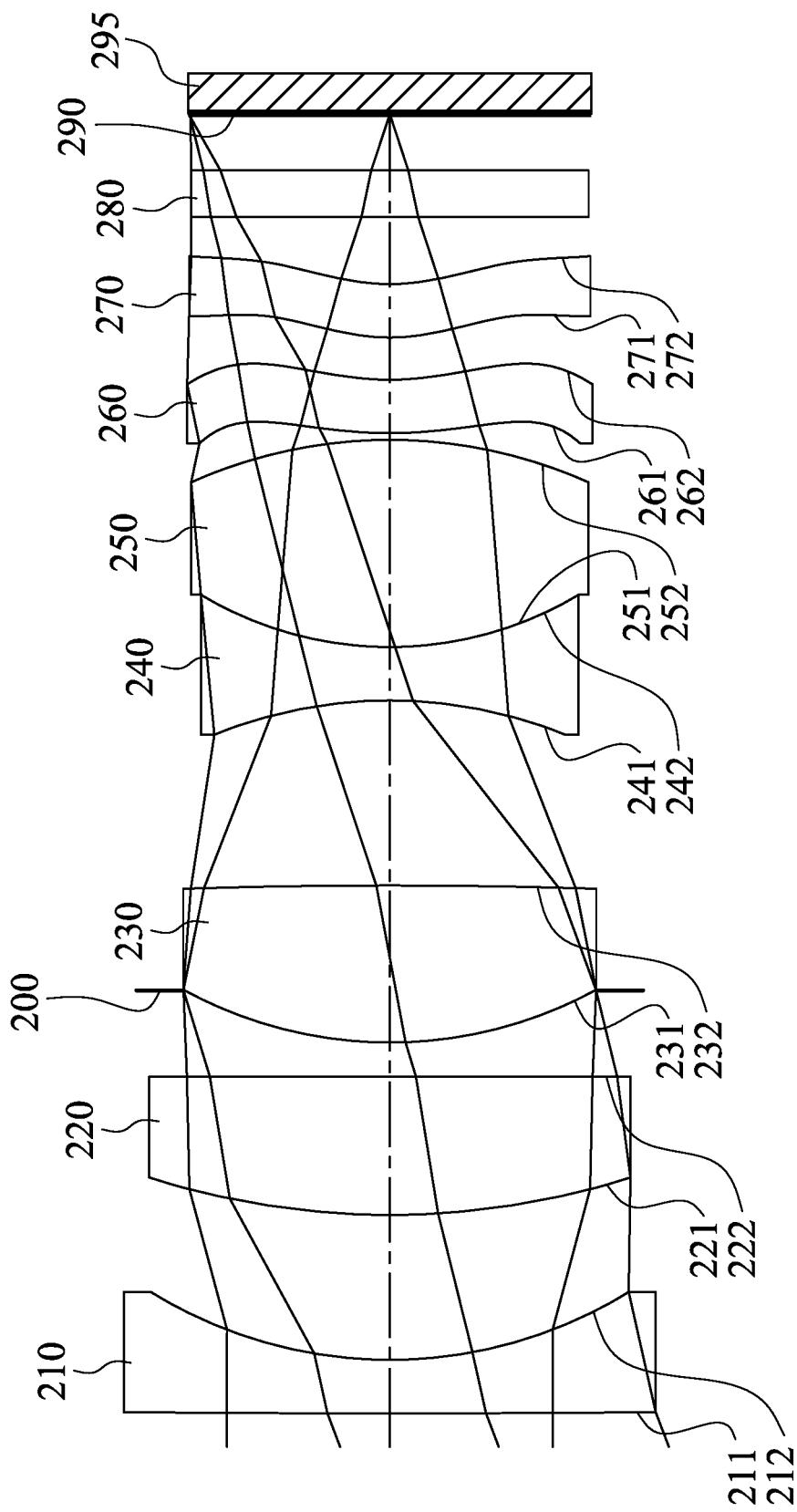
FIG. 3 is a schematic view of an image capturing device according to the 2nd embodiment of the present disclosure.
Figure 4:
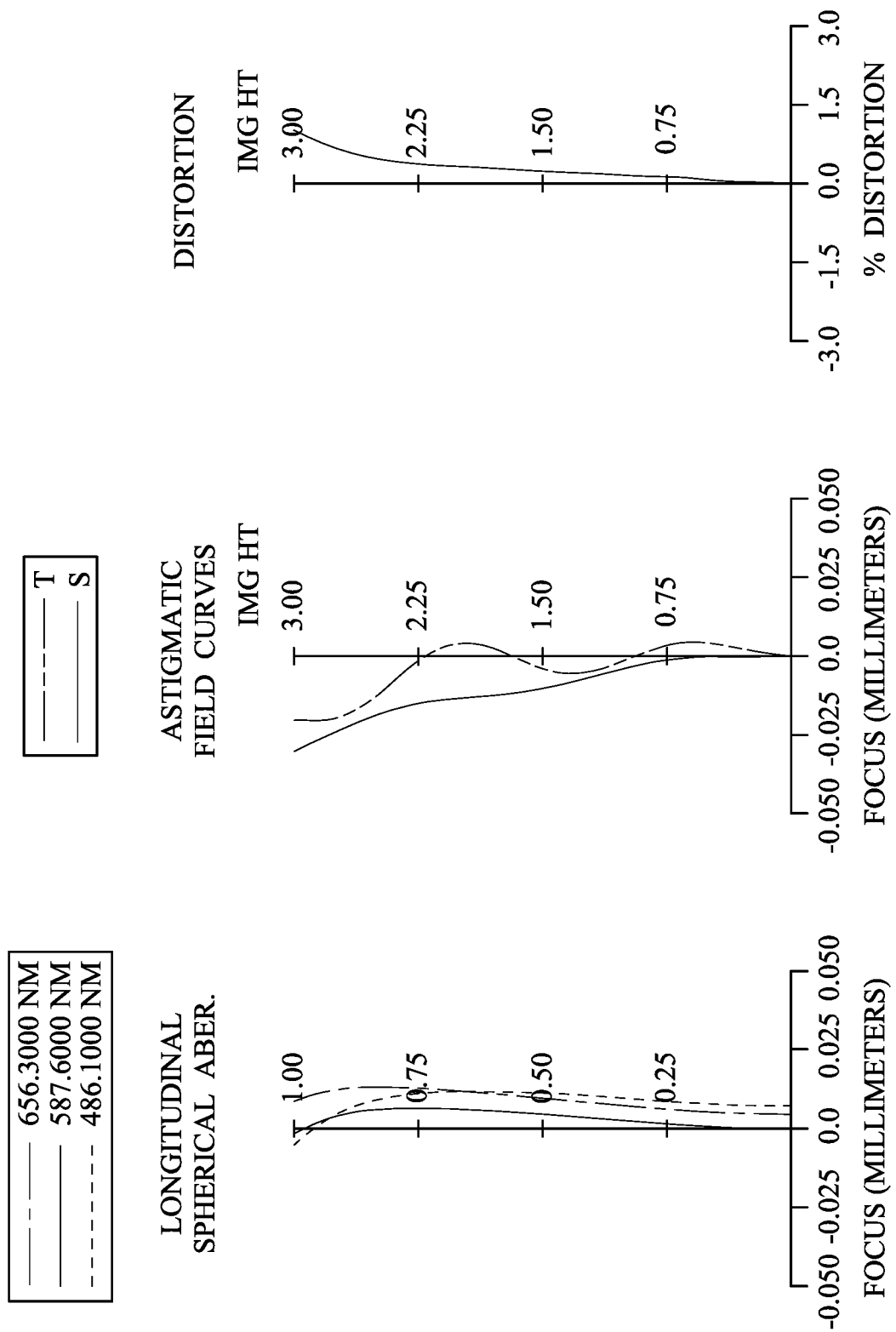
FIG. 4 shows spherical aberration curves, astigmatic field curves and a distortion curve of the image capturing device according to the 2nd embodiment.

FIG. 3 is a schematic view of an image capturing device according to the 2nd embodiment of the present disclosure. FIG. 4 shows spherical aberration curves, astigmatic field curves and a distortion curve of the image capturing device according to the 2nd embodiment. In FIG. 3, the image capturing device includes an optical image capturing system (its reference numeral is omitted) and an image sensor 295. The optical image capturing system includes, in order from an object side to an image side, a first lens element 210, a second lens element 220, an aperture stop 200, a third lens element 230, a fourth lens element 240, a fifth lens element 250, a sixth lens element 260, a seventh lens element 270, an IR-cut filter 280 and an image surface 290, wherein the image sensor 295 is disposed on the image surface 290 of the optical image capturing system. The optical image capturing system has a total of seventh lens elements (210-270) with refractive power. There is no relative movement among the lens elements (210-270) with refractive power.

The first lens element 210 with negative refractive power has an object-side surface 211 being convex in a paraxial region thereof and an image-side surface 212 being concave in a paraxial region thereof. The first lens element 210 is made of glass material.

The second lens element 220 with positive refractive power has an object-side surface 221 being convex in a paraxial region thereof and an image-side surface 222 being planar in a paraxial region thereof. The second lens element 220 is made of glass material.

The third lens element 230 with positive refractive power has an object-side surface 231 being convex in a paraxial region thereof and an image-side surface 232 being convex in a paraxial region thereof. The third lens element 230 is made of glass material.

The fourth lens element 240 with negative refractive power has an object-side surface 241 being concave in a paraxial region thereof and an image-side surface 242 being concave in a paraxial region thereof, wherein the image-side surface 242 of the fourth lens element 240 is cemented to the fifth lens element 250. The fourth lens element 240 is made of glass material.

The fifth lens element 250 with positive refractive power has an object-side surface 251 being convex in a paraxial region thereof and an image-side surface 252 being convex in a paraxial region thereof, wherein the object-side surface 251 of the fifth lens element 250 is cemented to the image-side surface 242 of the fourth lens element 240. The fifth lens element 250 is made of glass material.

The sixth lens element 260 with negative refractive power has an object-side surface 261 being convex in a paraxial region thereof, and an image-side surface 262 being concave in a paraxial region thereof and including at least one convex shape in an off-axial region thereof. The sixth lens element 260 is made of plastic material, and has the object-side surface 261 and the image-side surface 262 being both aspheric.

The seventh lens element 270 with positive refractive power has an object-side surface 271 being convex in a paraxial region thereof and including at least one concave shape in an off-axial region thereof, and an image-side surface 272 being concave in a paraxial region thereof and including at least one convex shape in an off-axial region thereof. The seventh lens element 270 is made of plastic material, and has the object-side surface 271 and the image-side surface 272 being both aspheric.

The IR-cut filter 280 is made of glass material and located between the seventh lens element 270 and the image surface 290, and will not affect a focal length of the optical image capturing system.

The detailed optical data of the 2nd embodiment are shown in Table 3 and the aspheric surface data are shown in Table 4 below.

TABLE 3

2nd Embodiment
f = 7.80 mm, Fno = 1.60, HFOV = 20.8 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Lens 1 | 500.000 | | 0.800 | Glass | 1.648 | 33.8 | −10.63 |
| 2 | | 6.790 | | 2.170 | | | | |
| 3 | Lens 2 | 11.849 | | 2.070 | Glass | 1.804 | 46.5 | 14.73 |
| 4 | | Plano | | 1.290 | | | | |
| 5 | Ape. Stop | Plano | | −0.780 | | | | |
| 6 | Lens 3 | 6.429 | | 2.350 | Glass | 1.729 | 54.7 | 8.36 |
| 7 | | −99.548 | | 2.770 | | | | |
| 8 | Lens 4 | −6.970 | | 0.800 | Glass | 1.785 | 25.7 | −3.81 |
| 9 | Lens 5 | 5.498 | | 3.100 | Glass | 1.804 | 46.5 | 4.36 |
| 10 | | −7.261 | | 0.100 | | | | |
| 11 | Lens 6 | 6.437 | ASP | 0.800 | Plastic | 1.639 | 23.5 | −22.09 |
| 12 | | 4.207 | ASP | 0.632 | | | | |
| 13 | Lens 7 | 2.992 | ASP | 0.800 | Plastic | 1.639 | 23.5 | 31.57 |
| 14 | | 3.147 | ASP | 1.000 | | | | |
| 15 | IR-cut filter | Plano | | 0.700 | Glass | 1.517 | 64.2 | — |
| 16 | | Plano | | 0.853 | | | | |
| 17 | Image | Plano | | — | | | | |

Note:
Reference wavelength is 587.6 nm (d-line).

TABLE 4

| Aspheric Coefficients | | | | |
|---|---|---|---|---|
| Surface # | 11 | 12 | 13 | 14 |
| k= | −1.4374E+01 | 4.4470E−01 | −4.1253E+00 | −2.4137E−01 |
| A4= | −6.8620E−04 | −1.9747E−02 | −9.6817E−03 | −2.3908E−02 |
| A6= | −1.0764E−03 | 1.3850E−03 | −1.4403E−03 | 2.1377E−04 |
| A8= | −5.5923E−06 | −2.9421E−04 | 2.6698E−04 | 1.2391E−04 |
| A10= | 1.7851E−05 | 2.4304E−05 | −1.0006E−05 | −7.6044E−06 |
| A12= | −4.1626E−06 | −7.0950E−07 | 4.0083E−15 | −2.1200E−17 |
| A14= | 2.6656E−07 | 6.1546E−20 | 4.6237E−17 | −2.6657E−20 |

In the 2nd embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 2nd embodiment, so an explanation in this regard will not be provided again.

Moreover, these parameters can be calculated from Table 3 and Table 4 as the following values and satisfy the following conditions:

| 2nd Embodiment | | | |
|---|---|---|---|
| f [mm] | 7.80 | R12/R14 | 1.34 |
| Fno | 1.60 | |f/R1| | 0.02 |
| HFOV [deg.] | 20.8 | f/R14 | 2.48 |
| CRA(Ymax) | 14.03 | Yc62/f | 0.26 |
| T23/CT2 | 0.25 | |f/f6| + |f/f7| | 0.60 |
| (CT6 + CT7)/T67 | 2.53 | f45 | 35.47 |
| ΣCT/Td | 0.63 | |ff/fr| | 9.19 |
| SDmax/SDmin | 1.52 | | |

3rd Embodiment

Figure 5:
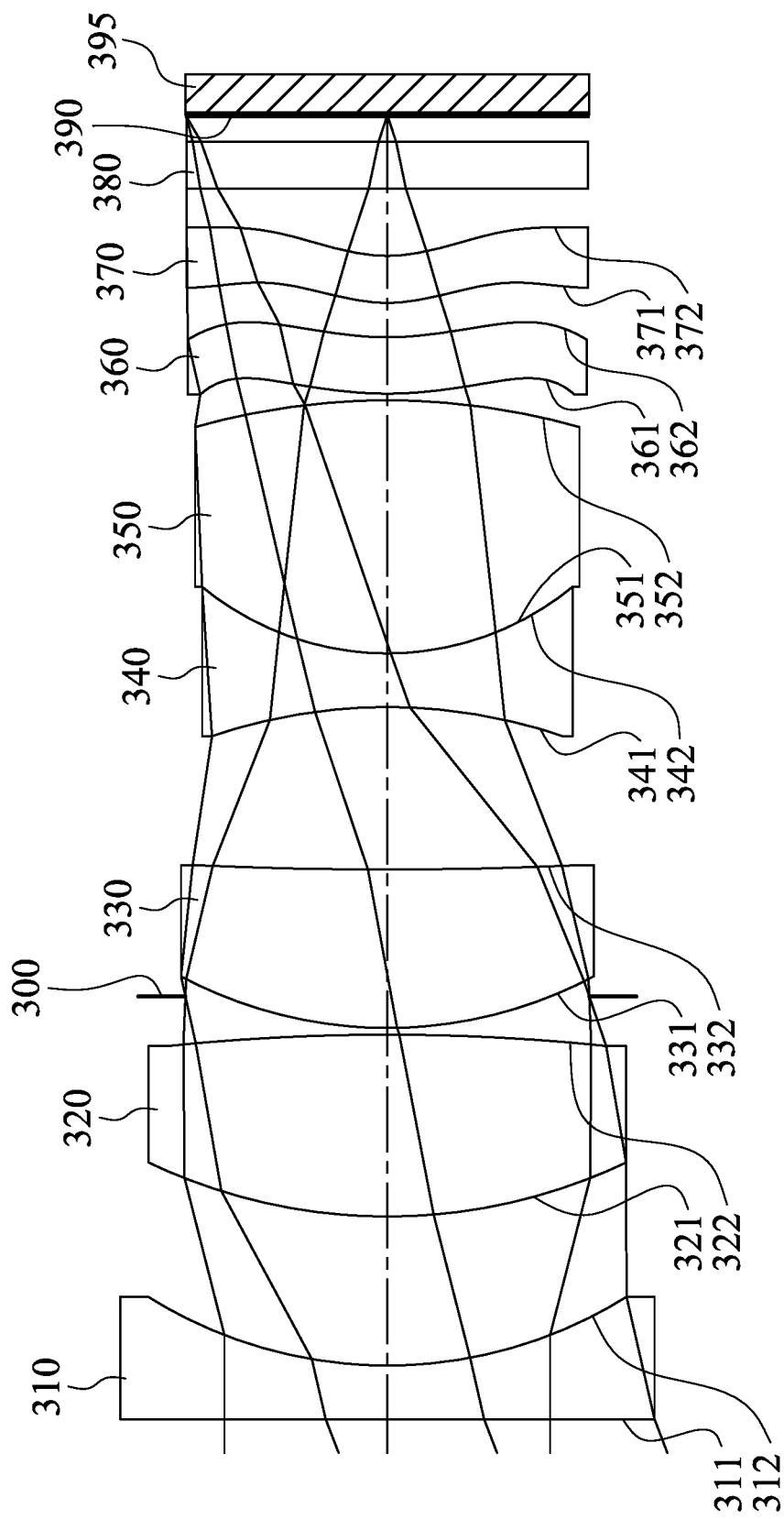
FIG. 5 is a schematic view of an image capturing device according to the 3rd embodiment of the present disclosure.
Figure 6:
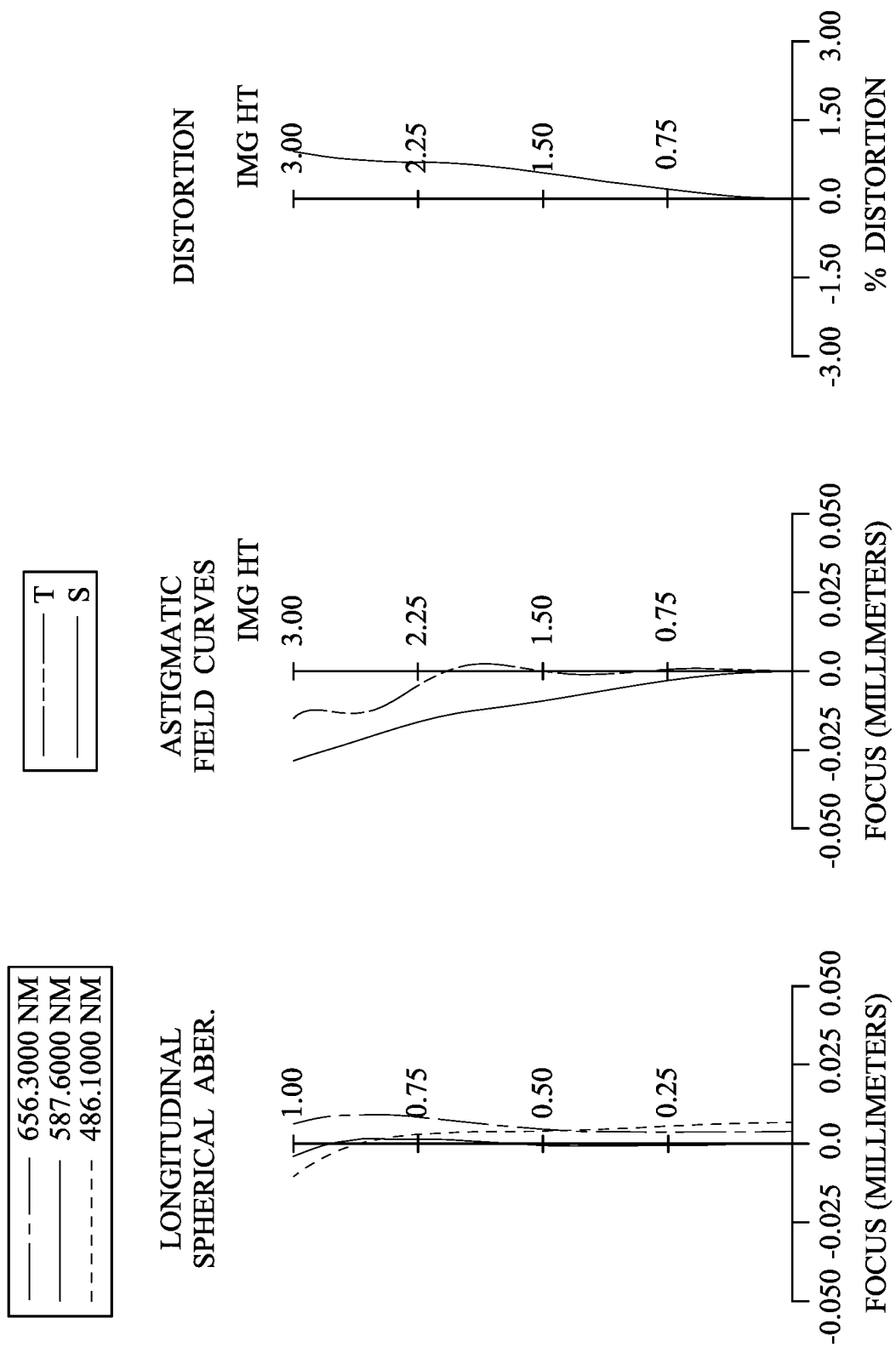
FIG. 6 shows spherical aberration curves, astigmatic field curves and a distortion curve of the image capturing device according to the 3rd embodiment.

FIG. 5 is a schematic view of an image capturing device according to the 3rd embodiment of the present disclosure. FIG. 6 shows spherical aberration curves, astigmatic field curves and a distortion curve of the image capturing device according to the 3rd embodiment. In FIG. 5, the image capturing device includes an optical image capturing system (its reference numeral is omitted) and an image sensor 395. The optical image capturing system includes, in order from an object side to an image side, a first lens element 310, a second lens element 320, an aperture stop 300, a third lens element 330, a fourth lens element 340, a fifth lens element 350, a sixth lens element 360, a seventh lens element 370, an IR-cut filter 380 and an image surface 390, wherein the image sensor 395 is disposed on the image surface 390 of the optical image capturing system. The optical image capturing system has a total of seventh lens elements (310-370) with refractive power. There is no relative movement among the lens elements (310-370) with refractive power.

The first lens element 310 with negative refractive power has an object-side surface 311 being planar in a paraxial region thereof and an image-side surface 312 being concave in a paraxial region thereof. The first lens element 310 is made of glass material.

The second lens element 320 with positive refractive power has an object-side surface 321 being convex in a paraxial region thereof and an image-side surface 322 being convex in a paraxial region thereof. The second lens element 320 is made of glass material.

The third lens element 330 with positive refractive power has an object-side surface 331 being convex in a paraxial region thereof and an image-side surface 332 being concave in a paraxial region thereof. The third lens element 330 is made of glass material.

The fourth lens element 340 with negative refractive power has an object-side surface 341 being concave in a paraxial region thereof and an image-side surface 342 being concave in a paraxial region thereof, wherein the image-side surface 342 of the fourth lens element 340 is cemented to the fifth lens element 350. The fourth lens element 340 is made of glass material.

The fifth lens element 350 with positive refractive power has an object-side surface 351 being convex in a paraxial region thereof and an image-side surface 352 being convex in a paraxial region thereof, wherein the object-side surface 351 of the fifth lens element 350 is cemented to the image-side surface 342 of the fourth lens element 340. The fifth lens element 350 is made of glass material.

The sixth lens element 360 with negative refractive power has an object-side surface 361 being convex in a paraxial region thereof, and an image-side surface 362 being concave in a paraxial region thereof and including at least one convex shape in an off-axial region thereof. The sixth lens element 360 is made of plastic material, and has the object-side surface 361 and the image-side surface 362 being both aspheric.

The seventh lens element 370 with positive refractive power has an object-side surface 371 being convex in a paraxial region thereof and including at least one concave shape in an off-axial region thereof, and an image-side surface 372 being concave in a paraxial region thereof and including at least one convex shape in an off-axial region thereof. The seventh lens element 370 is made of plastic material, and has the object-side surface 371 and the image-side surface 372 being both aspheric.

The IR-cut filter 380 is made of glass material and located between the seventh lens element 370 and the image surface 390, and will not affect a focal length of the optical image capturing system.

The detailed optical data of the 3rd embodiment are shown in Table 5 and the aspheric surface data are shown in Table 6 below.

TABLE 5

3rd Embodiment
f = 7.76 mm, Fno = 1.60, HFOV = 21.0 deg.

| Surface # | | Curvature Radius | Thickness | Material | Index | Abbe # | Focal Length |
|---|---|---|---|---|---|---|---|
| 0 | Object | Plano | Infinity | | | | |
| 1 | Lens 1 | Plano | 0.800 | Glass | 1.606 | 43.7 | −11.07 |
| 2 | | 6.704 | 2.220 | | | | |
| 3 | Lens 2 | 8.244 | 2.710 | Glass | 1.564 | 60.7 | 11.89 |
| 4 | | −31.646 | 0.570 | | | | |
| 5 | Ape. Stop | Plano | −0.470 | | | | |
| 6 | Lens 3 | 6.530 | 2.360 | Glass | 1.729 | 54.7 | 9.80 |
| 7 | | 64.295 | 2.420 | | | | |
| 8 | Lens 4 | −8.062 | 0.800 | Glass | 1.762 | 26.5 | −3.60 |
| 9 | Lens 5 | 4.329 | 3.770 | Glass | 1.804 | 46.5 | 4.29 |
| 10 | | −10.450 | 0.100 | | | | |
| 11 | Lens 6 | 5.909 ASP | 0.839 | Plastic | 1.639 | 23.5 | −32.60 |
| 12 | | 4.348 ASP | 0.514 | | | | |
| 13 | Lens 7 | 2.390 ASP | 0.700 | Plastic | 1.535 | 55.7 | 49.93 |
| 14 | | 2.357 ASP | 1.000 | | | | |
| 15 | IR-cut filter | Plano | 0.700 | Glass | 1.517 | 64.2 | — |
| 16 | | Plano | 0.403 | | | | |
| 17 | Image | Plano | — | | | | |

Note:
Reference wavelength is 587.6 nm (d-line).

TABLE 6

Aspheric Coefficients

| Surface # | 11 | 12 | 13 | 14 |
|---|---|---|---|---|
| k= | −2.4210E+00 | −2.3785E+01 | −6.2139E+00 | −4.2672E+00 |
| A4= | −5.1913E−03 | 2.3700E−03 | −1.3606E−02 | −1.3837E−02 |
| A6= | 9.9875E−04 | −1.1898E−03 | −1.3581E−03 | −2.3148E−04 |
| A8= | −5.7914E−04 | −7.0983E−05 | 3.6059E−04 | 1.8010E−04 |
| A10= | 1.0688E−04 | 1.4458E−05 | −1.6618E−05 | −9.4221E−06 |
| A12= | −1.2067E−05 | −4.3378E−07 | 4.5890E−10 | −4.5816E−12 |
| A14= | 5.6073E−07 | 2.1840E−18 | 4.7179E−17 | −4.3678E−18 |

In the 3rd embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 3rd embodiment, so an explanation in this regard will not be provided again.

Moreover, these parameters can be calculated from Table 5 and Table 6 as the following values and satisfy the following conditions:

| 3rd Embodiment | | | |
|---|---|---|---|
| f [mm] | 7.76 | R12/R14 | 1.84 |
| Fno | 1.60 | \|f/R1\| | 0.00 |
| HFOV [deg.] | 21.0 | f/R14 | 3.29 |
| CRA(Ymax) | 14.03 | Yc62/f | 0.27 |
| T23/CT2 | 0.04 | \|f/f6\| + \|f/f7\| | 0.39 |
| (CT6 + CT7)/T67 | 2.99 | f45 | 105.03 |
| ΣCT/Td | 0.69 | \|ff/fr\| | 7.08 |
| SDmax/SDmin | 1.52 | | |

4th Embodiment

Figure 7:
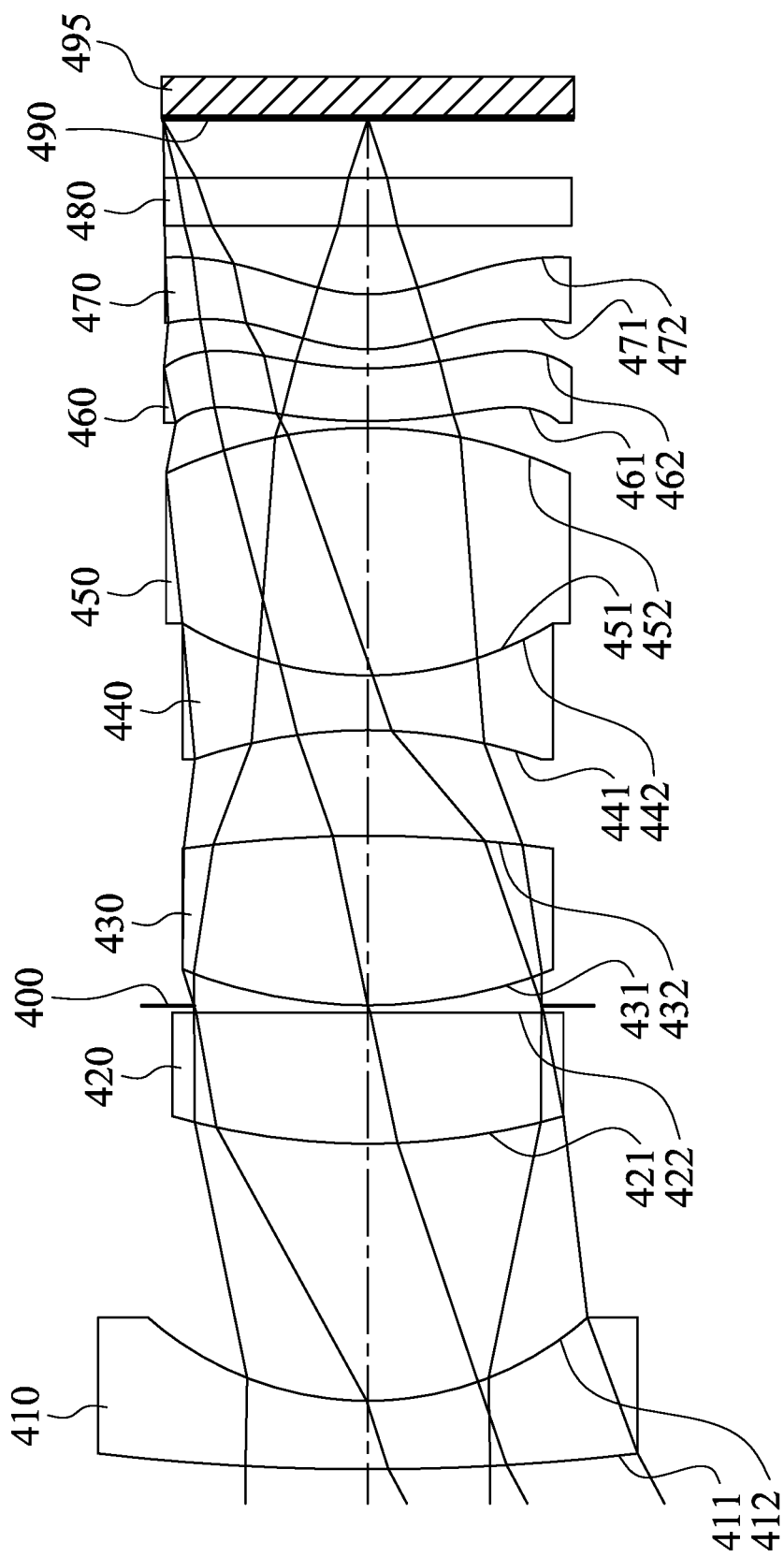
FIG. 7 is a schematic view of an image capturing device according to the 4th embodiment of the present disclosure.
Figure 8:
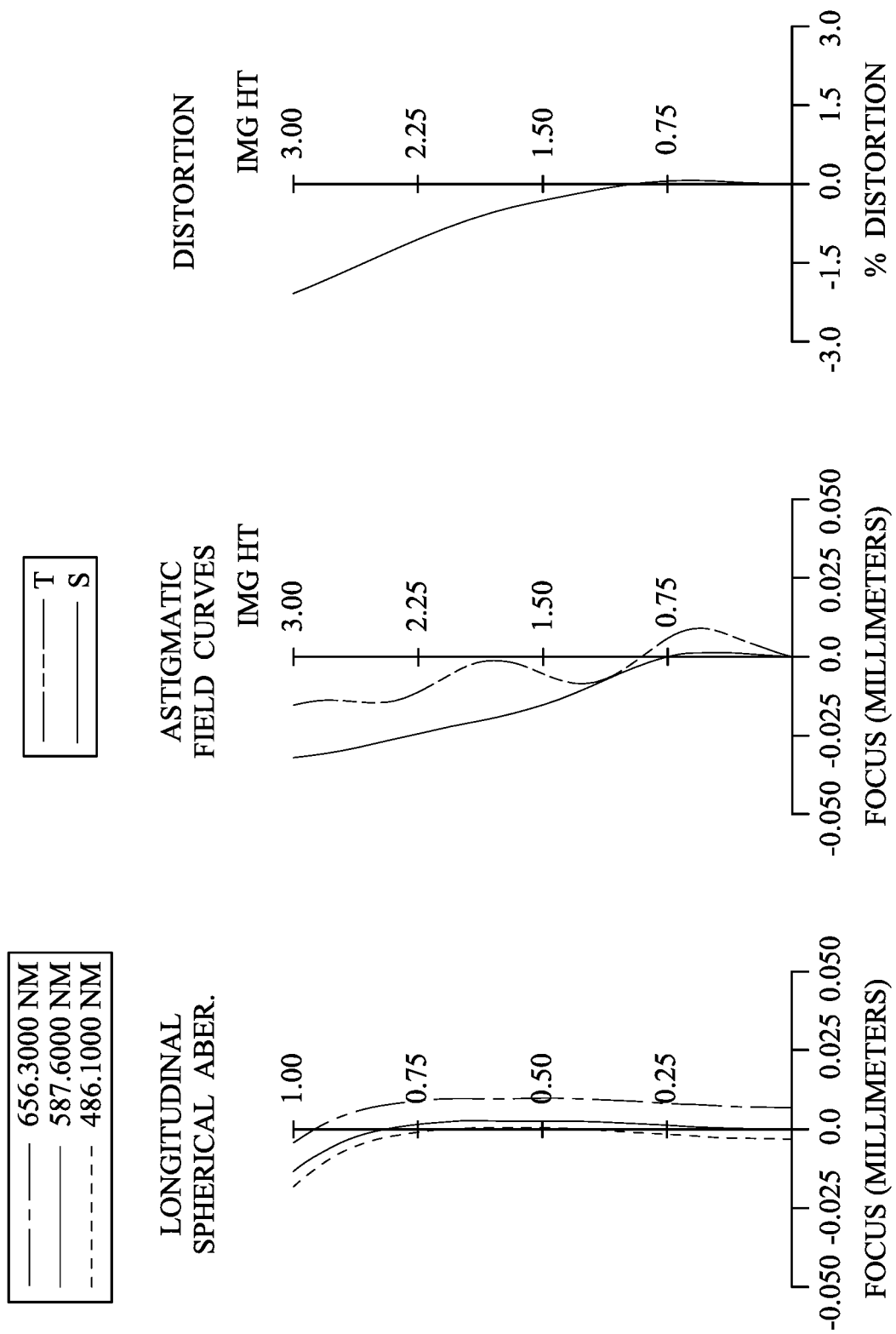
FIG. 8 shows spherical aberration curves, astigmatic field curves and a distortion curve of the image capturing device according to the 4th embodiment.

FIG. 7 is a schematic view of an image capturing device according to the 4th embodiment of the present disclosure. FIG. 8 shows spherical aberration curves, astigmatic field curves and a distortion curve of the image capturing device according to the 4th embodiment. In FIG. 7, the image capturing device includes an optical image capturing system (its reference numeral is omitted) and an image sensor 495. The optical image capturing system includes, in order from an object side to an image side, a first lens element 410, a second lens element 420, an aperture stop 400, a third lens element 430, a fourth lens element 440, a fifth lens element 450, a sixth lens element 460, a seventh lens element 470, an IR-cut filter 480 and an image surface 490, wherein the image sensor 495 is disposed on the image surface 490 of the optical image capturing system. The optical image capturing system has a total of seventh lens elements (410-470) with refractive power. There is no relative movement among the lens elements (410-470) with refractive power.

The first lens element 410 with negative refractive power has an object-side surface 411 being convex in a paraxial region thereof and an image-side surface 412 being concave in a paraxial region thereof. The first lens element 410 is made of glass material.

The second lens element 420 with positive refractive power has an object-side surface 421 being convex in a paraxial region thereof and an image-side surface 422 being planar in a paraxial region thereof. The second lens element 420 is made of glass material.

The third lens element 430 with positive refractive power has an object-side surface 431 being convex in a paraxial region thereof and an image-side surface 432 being convex in a paraxial region thereof. The third lens element 430 is made of glass material.

The fourth lens element 440 with negative refractive power has an object-side surface 441 being concave in a paraxial region thereof and an image-side surface 442 being concave in a paraxial region thereof, wherein the image-side surface 442 of the fourth lens element 440 is cemented to the fifth lens element 450. The fourth lens element 440 is made of glass material.

The fifth lens element 450 with positive refractive power has an object-side surface 451 being convex in a paraxial region thereof and an image-side surface 452 being convex in a paraxial region thereof, wherein the object-side surface 451 of the fifth lens element 450 is cemented to the image-side surface 442 of the fourth lens element 440. The fifth lens element 450 is made of glass material.

The sixth lens element 460 with negative refractive power has an object-side surface 461 being convex in a paraxial region thereof, and an image-side surface 462 being concave in a paraxial region thereof and including at least one convex shape in an off-axial region thereof. The sixth lens element 460 is made of plastic material, and has the object-side surface 461 and the image-side surface 462 being both aspheric.

The seventh lens element 470 with positive refractive power has an object-side surface 471 being convex in a paraxial region thereof and including at least one concave shape in an off-axial region thereof, and an image-side surface 472 being concave in a paraxial region thereof and including at least one convex shape in an off-axial region thereof. The seventh lens element 470 is made of plastic material, and has the object-side surface 471 and the image-side surface 472 being both aspheric.

The IR-cut filter 480 is made of glass material and located between the seventh lens element 470 and the image surface 490, and will not affect a focal length of the optical image capturing system.

The detailed optical data of the 4th embodiment are shown in Table 7 and the aspheric surface data are shown in Table 7 below.

TABLE 7

4th Embodiment
f = 5.71 mm, Fno = 1.60, HFOV = 28.2 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Lens 1 | 33.710 | | 1.000 | Glass | 1.569 | 56.0 | -10.04 |
| 2 | | 4.832 | | 3.750 | | | | |
| 3 | Lens 2 | 10.330 | | 1.910 | Glass | 1.729 | 54.7 | 14.17 |
| 4 | | Plano | | 0.100 | | | | |
| 5 | Ape. Stop | Plano | | 0.010 | | | | |
| 6 | Lens 3 | 7.209 | | 2.470 | Glass | 1.743 | 49.3 | 7.38 |
| 7 | | -19.567 | | 1.540 | | | | |
| 8 | Lens 4 | -7.765 | | 0.800 | Glass | 1.847 | 23.8 | -3.57 |
| 9 | Lens 5 | 5.183 | | 3.610 | Glass | 1.804 | 46.6 | 4.24 |
| 10 | | -6.861 | | 0.100 | | | | |
| 11 | Lens 6 | 7.935 | ASP | 0.770 | Plastic | 1.639 | 23.5 | -21.26 |
| 12 | | 4.820 | ASP | 0.281 | | | | |

TABLE 7-continued

4th Embodiment
f = 5.71 mm, Fno = 1.60, HFOV = 28.2 deg.

| Surface # | | Curvature Radius | | Thickness | Material | Index | Abbe # | Focal Length |
|---|---|---|---|---|---|---|---|---|
| 13 | Lens 7 | 2.485 | ASP | 0.800 | Plastic | 1.639 | 23.5 | 26.00 |
| 14 | | 2.555 | ASP | 1.000 | | | | |
| 15 | IR-cut filter | Plano | | 0.700 | Glass | 1.517 | 64.2 | — |
| 16 | | Plano | | 0.872 | | | | |
| 17 | Image | Plano | | — | | | | |

Note:
Reference wavelength is 587.6 nm (d-line).

TABLE 8

| | Aspheric Coefficients | | | |
|---|---|---|---|---|
| Surface # | 11 | 12 | 13 | 14 |
| k= | 6.0103E+00 | 1.1713E+00 | −4.3483E+00 | −5.1977E−01 |
| A4= | 1.0855E−03 | −1.4813E−02 | −6.1667E−03 | −2.7827E−02 |
| A6= | −2.3734E−03 | 1.8280E−03 | −2.2264E−03 | 4.8473E−04 |
| A8= | 3.6873E−04 | −5.3879E−04 | 3.8340E−04 | 1.1935E−04 |
| A10= | −6.7930E−05 | 5.4902E−05 | −1.8615E−05 | −9.8418E−06 |
| A12= | 5.9222E−06 | −2.2340E−06 | 4.0090E−15 | −2.3161E−17 |
| A14= | −2.3883E−07 | 6.2203E−20 | 4.6240E−17 | −2.8404E−20 |

In the 4th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 4th embodiment, so an explanation in this regard will not be provided again.

Moreover, these parameters can be calculated from Table 7 and Table 8 as the following values and satisfy the following conditions:

| 4th Embodiment | | | |
|---|---|---|---|
| f [mm] | 5.71 | R12/R14 | 1.89 |
| Fno | 1.60 | |f/R1| | 0.17 |
| HFOV [deg.] | 28.2 | f/R14 | 2.23 |
| CRA(Ymax) | 13.99 | Yc62/f | 0.38 |
| T23/CT2 | 0.06 | |f/f6| + |f/f7| | 0.49 |
| (CT6 + CT7)/T67 | 5.59 | f45 | 30.63 |
| ΣCT/Td | 0.66 | |ff/fr| | 38.26 |
| SDmax/SDmin | 1.56 | | |

5th Embodiment

Figure 9:
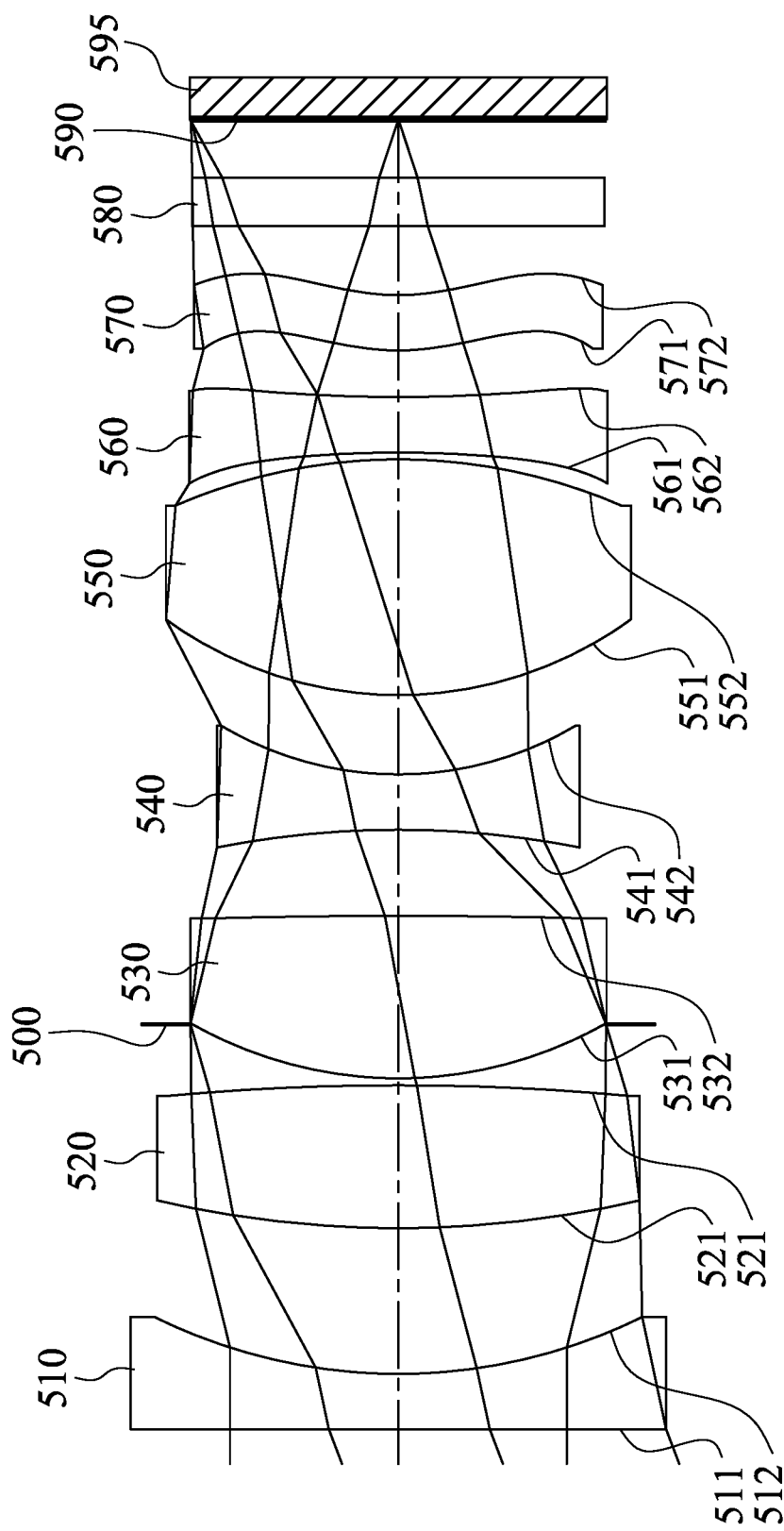
FIG. 9 is a schematic view of an image capturing device according to the embodiment of the present disclosure.
Figure 10:
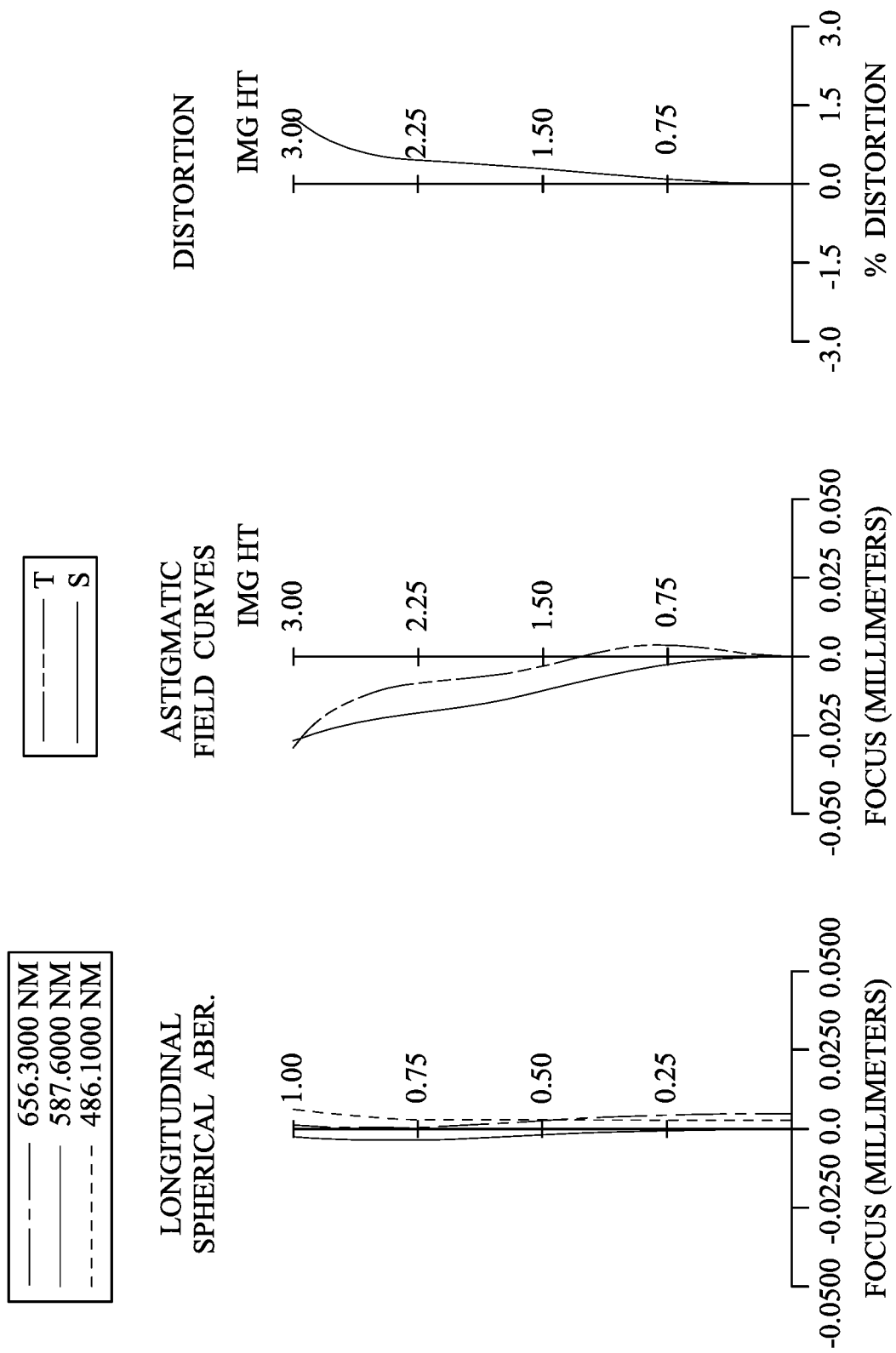
FIG. 10 shows spherical aberration curves, astigmatic field curves and a distortion curve of the image capturing device according to the 5th embodiment.

FIG. 9 is a schematic view of an image capturing device according to the embodiment of the present disclosure. FIG. 10 shows spherical aberration curves, astigmatic field curves and a distortion curve of the image capturing device according to the 5th embodiment. In FIG. 9, the image capturing device includes an optical image capturing system (its reference numeral is omitted) and an image sensor 595. The optical image capturing system includes, in order from an object side to an image side, a first lens element 510, a second lens element 520, an aperture stop 500, a third lens element 530, a fourth lens element 540, a fifth lens element 550, a sixth lens element 560, a seventh lens element 570, an IR-cut filter 580 and an image surface 590, wherein the image sensor 595 is disposed on the image surface 590 of the optical image capturing system. The optical image capturing system has a total of seventh lens elements (510-570) with refractive power. There is no relative movement among the lens elements (510-570) with refractive power.

The first lens element 510 with negative refractive power has an object-side surface 511 being planar in a paraxial region thereof and an image-side surface 512 being concave in a paraxial region thereof. The first lens element 510 is made of glass material.

The second lens element 520 with positive refractive power has an object-side surface 521 being convex in a paraxial region thereof and an image-side surface 522 being convex in a paraxial region thereof. The second lens element 520 is made of glass material.

The third lens element 530 with positive refractive power has an object-side surface 531 being convex in a paraxial region thereof and an image-side surface 532 being convex in a paraxial region thereof. The third lens element 530 is made of glass material.

The fourth lens element 540 with negative refractive power has an object-side surface 541 being concave in a paraxial region thereof and an image-side surface 542 being concave in a paraxial region thereof. The fourth lens element 540 is made of glass material.

The fifth lens element 550 with positive refractive power has an object-side surface 551 being convex in a paraxial region thereof and an image-side surface 552 being convex in a paraxial region thereof. The fifth lens element 550 is made of glass material.

The sixth lens element 560 with negative refractive power has an object-side surface 561 being concave in a paraxial region thereof, and an image-side surface 562 being concave in a paraxial region thereof and including at least one convex shape in an off-axial region thereof. The sixth lens element 560 is made of plastic material, and has the object-side surface 561 and the image-side surface 562 being both aspheric.

The seventh lens element 570 with positive refractive power has an object-side surface 571 being convex in a paraxial region thereof and including at least one concave shape in an off-axial region thereof, and an image-side surface 572 being concave in a paraxial region thereof and including at least one convex shape in an off-axial region thereof. The seventh lens element 570 is made of plastic material, and has the object-side surface 571 and the image-side surface 572 being both aspheric.

The IR-cut filter 580 is made of glass material and located between the seventh lens element 570 and the image surface 590, and will not affect a focal length of the optical image capturing system.

The detailed optical data of the 5th embodiment are shown in Table 9 and the aspheric surface data are shown in Table 10 below.

| 5th Embodiment | | | |
|---|---|---|---|
| f [mm] | 7.79 | R12/R14 | 5.92 |
| Fno | 1.60 | |f/R1| | 0.00 |
| HFOV [deg.] | 20.8 | f/R14 | 2.29 |
| CRA(Ymax) | 14.00 | Yc62/f | 0.34 |
| T23/CT2 | 0.05 | |f/f6| + |f/f7| | 0.65 |
| (CT6 + CT7)/T67 | 2.37 | f45 | 13.69 |
| ΣCT/Td | 0.67 | |ff/fr| | 327.43 |
| SDmax/SDmin | 1.51 | | |

TABLE 9

5th Embodiment
f = 7.79 mm, Fno = 1.60, HFOV = 20.8 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Lens 1 | Plano | | 0.800 | Glass | 1.709 | 38.7 | −11.22 |
| 2 | | 7.956 | | 2.107 | | | | |
| 3 | Lens 2 | 15.311 | | 2.067 | Glass | 1.804 | 46.6 | 13.62 |
| 4 | | −36.177 | | 0.880 | | | | |
| 5 | Ape. Stop | Plano | | −0.780 | | | | |
| 6 | Lens 3 | 6.059 | | 2.350 | Glass | 1.785 | 48.3 | 7.35 |
| 7 | | −101.670 | | 1.245 | | | | |
| 8 | Lens 4 | −13.500 | | 0.800 | Glass | 1.761 | 26.8 | −4.71 |
| 9 | | 5.008 | | 1.148 | | | | |
| 10 | Lens 5 | 5.707 | | 3.408 | Glass | 1.729 | 54.7 | 5.13 |
| 11 | | −8.095 | | 0.100 | | | | |
| 12 | Lens 6 | −15.705 | ASP | 0.800 | Plastic | 1.639 | 23.5 | −13.68 |
| 13 | | 20.122 | ASP | 0.675 | | | | |
| 14 | Lens 7 | 3.524 | ASP | 0.800 | Plastic | 1.639 | 23.5 | 101.37 |
| 15 | | 3.397 | ASP | 1.000 | | | | |
| 16 | IR-cut filter | Plano | | 0.700 | Glass | 1.517 | 64.2 | — |
| 17 | | Plano | | 0.847 | | | | |
| 18 | Image | Plano | | — | | | | |

Note:
Reference wavelength is 587.6 nm (d-line).

TABLE 10

Aspheric Coefficients

| Surface # | 12 | 13 | 14 | 15 |
|---|---|---|---|---|
| k= | 2.2516E+01 | 3.6872E+01 | −3.8895E+00 | −4.6134E−02 |
| A4= | 2.5315E−03 | −2.3104E−03 | −1.1743E−02 | −2.2728E−02 |
| A6= | −6.6091E−04 | 4.9370E−04 | −1.8341E−04 | 4.5498E−04 |
| A8= | 6.7945E−05 | −1.0403E−04 | 1.0484E−05 | −2.2112E−05 |
| A10= | −3.3848E−06 | 1.1268E−05 | −8.8605E−07 | 4.2558E−07 |
| A12= | −1.4420E−07 | −7.3728E−07 | 4.0054E−15 | −1.7198E−17 |
| A14= | 1.8645E−08 | 6.9715E−20 | 4.6237E−17 | −1.7669E−20 |

In the 5th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 5th embodiment, so an explanation in this regard will not be provided again.

Moreover, these parameters can be calculated from Table 9 and Table 10 as the following values and satisfy the following conditions:

6th Embodiment

Figure 11:
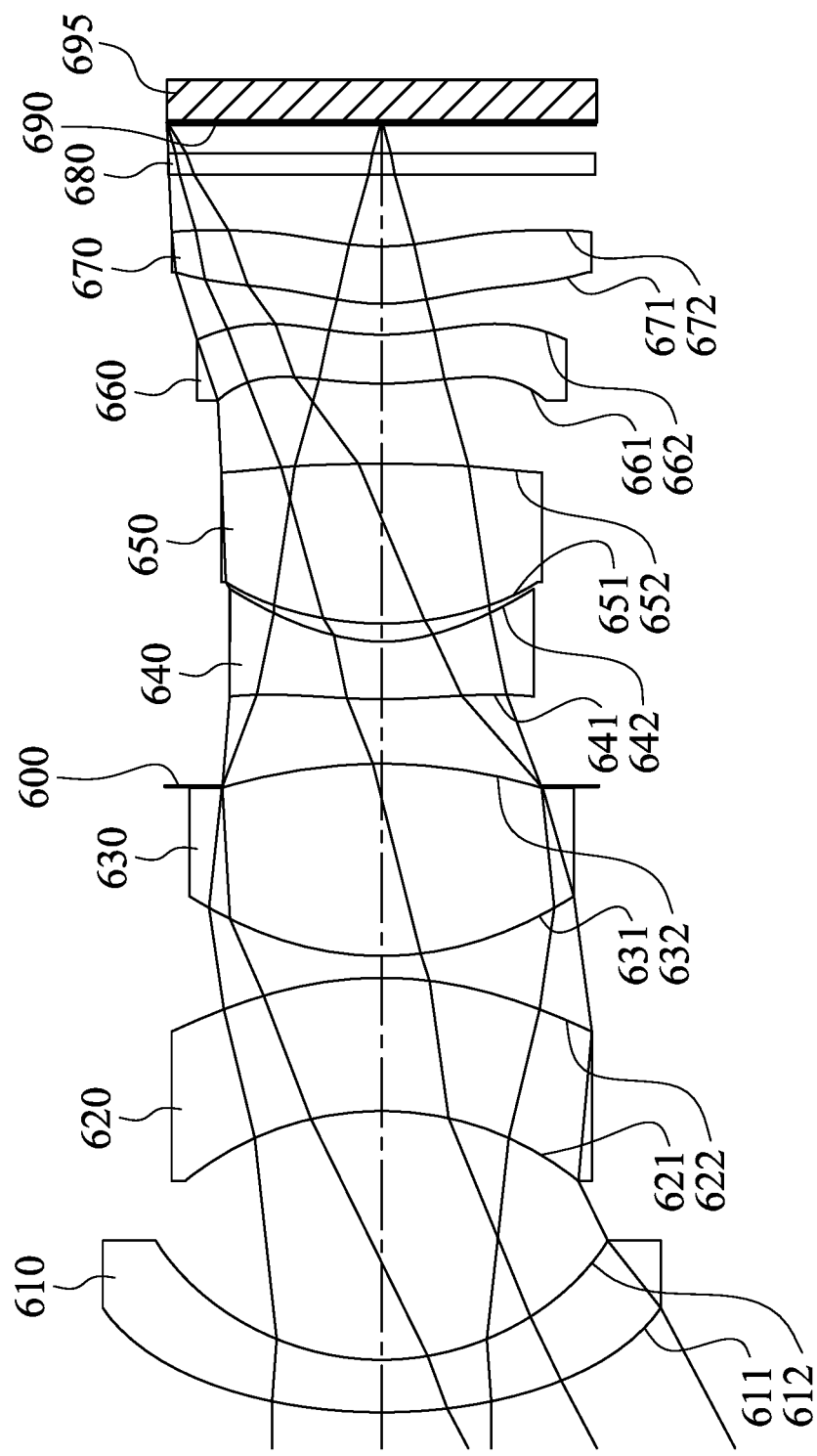
FIG. 11 is a schematic view of an image capturing device according to the 6th embodiment of the present disclosure.
Figure 12:
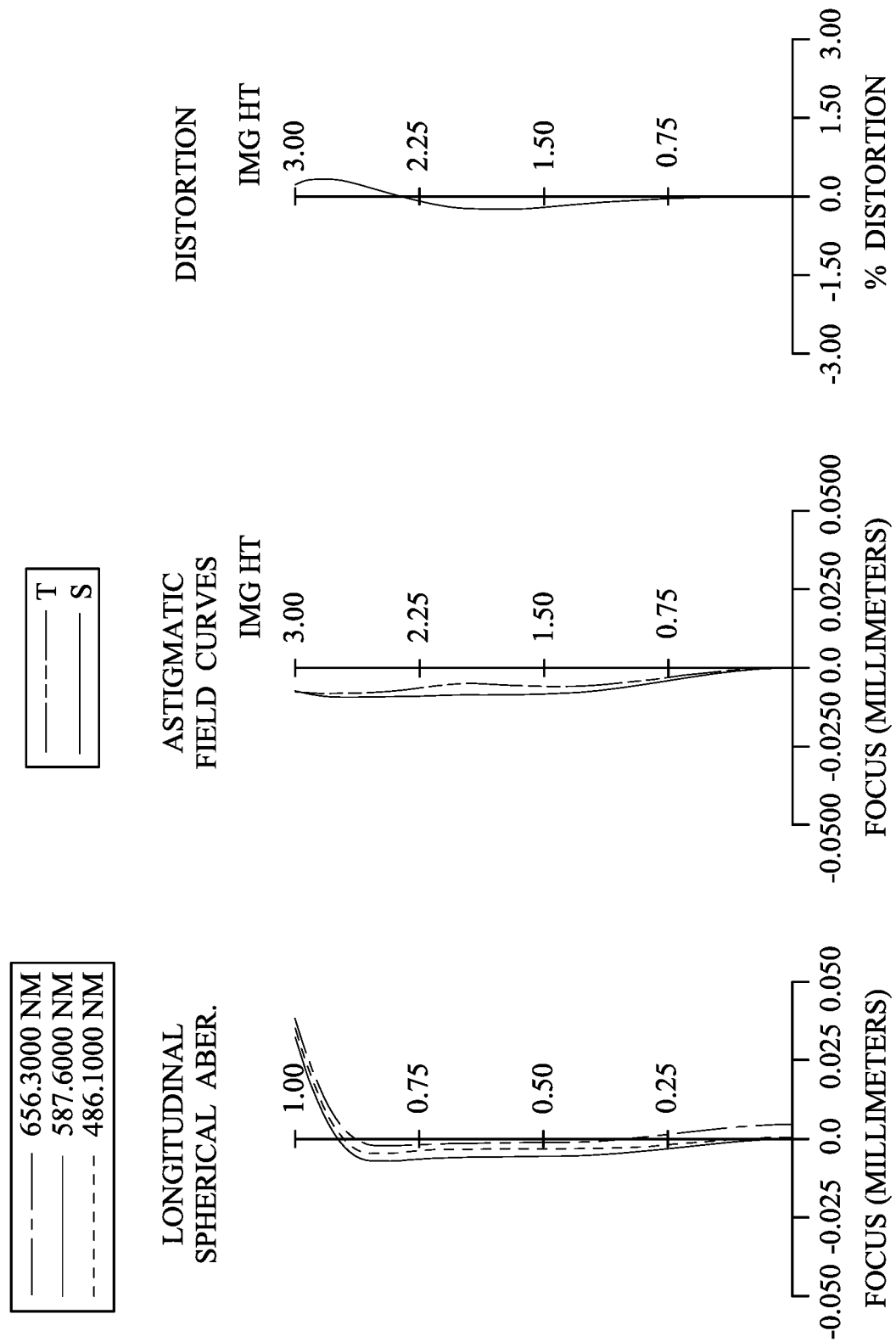
FIG. 12 shows spherical aberration curves, astigmatic field curves and a distortion curve of the image capturing device according to the 6th embodiment.

FIG. 11 is a schematic view of an image capturing device according to the 6th embodiment of the present disclosure. FIG. 12 shows spherical aberration curves, astigmatic field curves and a distortion curve of the image capturing device according to the 6th embodiment. In FIG. 11, the image capturing device includes an optical image capturing system (its reference numeral is omitted) and an image sensor 695. The optical image capturing system includes, in order from an object side to an image side, a first lens element 610, a second lens element 620, a third lens element 630, an aperture stop 600, a fourth lens element 640, a fifth lens element 650, a sixth lens element 660, a seventh lens element 670, an IR-cut filter 680 and an image surface 690, wherein the image sensor 695 is disposed on the image surface 690 of the optical image capturing system. The optical image capturing system has a total of seventh lens elements (610-670) with refractive power. There is no relative movement among the lens elements (610-670) with refractive power.

The first lens element 610 with negative refractive power has an object-side surface 611 being convex in a paraxial region thereof and an image-side surface 612 being concave in a paraxial region thereof. The first lens element 610 is made of plastic material, and has the object-side surface 611 and the image-side surface 612 being both aspheric.

The second lens element 620 with negative refractive power has an object-side surface 621 being concave in a paraxial region thereof and an image-side surface 622 being convex in a paraxial region thereof. The second lens element 620 is made of plastic material, and has the object-side surface 621 and the image-side surface 622 being both aspheric.

The third lens element 630 with positive refractive power has an object-side surface 631 being convex in a paraxial region thereof and an image-side surface 632 being convex in a paraxial region thereof. The third lens element 630 is made of plastic material, and has the object-side surface 631 and the image-side surface 632 being both aspheric.

The fourth lens element 640 with negative refractive power has an object-side surface 641 being convex in a paraxial region thereof and an image-side surface 642 being concave in a paraxial region thereof. The fourth lens element 640 is made of plastic material, and has the object-side surface 641 and the image-side surface 642 being both aspheric.

The fifth lens element 650 with positive refractive power has an object-side surface 651 being convex in a paraxial region thereof and an image-side surface 652 being convex in a paraxial region thereof. The fifth lens element 650 is made of plastic material, and has the object-side surface 651 and the image-side surface 652 being both aspheric.

The sixth lens element 660 with negative refractive power has an object-side surface 661 being convex in a paraxial region thereof, and an image-side surface 662 being concave in a paraxial region thereof and including at least one convex shape in an off-axial region thereof. The sixth lens element 660 is made of plastic material, and has the object-side surface 661 and the image-side surface 662 being both aspheric.

The seventh lens element 670 with positive refractive power has an object-side surface 671 being convex in a paraxial region thereof and including at least one concave shape in an off-axial region thereof, and an image-side surface 672 being concave in a paraxial region thereof and including at least one convex shape in an off-axial region thereof. The seventh lens element 670 is made of plastic material, and has the object-side surface 671 and the image-side surface 672 being both aspheric.

The IR-cut filter 680 is made of glass material and located between the seventh lens element 670 and the image surface 690, and will not affect a focal length of the optical image capturing system.

The detailed optical data of the 6th embodiment are shown in Table 11 and the aspheric surface data are shown in Table 12 below.

TABLE 11

6th Embodiment
f = 5.65 mm, Fno = 1.85, HFOV = 27.9 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Lens 1 | 8.017 | ASP | 0.733 | Plastic | 1.530 | 55.8 | −15.05 |
| 2 | | 3.872 | ASP | 3.471 | | | | |
| 3 | Lens 2 | −4.524 | ASP | 1.858 | Plastic | 1.650 | 21.5 | −129.56 |
| 4 | | −5.554 | ASP | 0.308 | | | | |
| 5 | Lens 3 | 4.486 | ASP | 2.682 | Plastic | 1.544 | 55.9 | 5.58 |
| 6 | | −7.418 | ASP | −0.313 | | | | |
| 7 | Ape. Stop | Plano | | 1.216 | | | | |
| 8 | Lens 4 | 8.590 | ASP | 0.800 | Plastic | 1.650 | 21.5 | −5.20 |
| 9 | | 2.339 | ASP | 0.253 | | | | |
| 10 | Lens 5 | 4.236 | ASP | 2.232 | Plastic | 1.544 | 55.9 | 6.99 |
| 11 | | −30.303 | ASP | 1.120 | | | | |
| 12 | Lens 6 | 5.284 | ASP | 0.682 | Plastic | 1.639 | 23.5 | −25.31 |
| 13 | | 3.782 | ASP | 0.433 | | | | |
| 14 | Lens 7 | 2.999 | ASP | 0.800 | Plastic | 1.544 | 55.9 | 26.89 |
| 15 | | 3.417 | ASP | 1.000 | | | | |
| 16 | IR-cut filter | Plano | | 0.300 | Glass | 1.517 | 64.2 | — |
| 17 | | Plano | | 0.427 | | | | |
| 18 | Image | Plano | | — | | | | |

Note:
Reference wavelength is 587.6 nm (d-line).

TABLE 12

| Aspheric Coefficients | | | | | |
|---|---|---|---|---|---|
| Surface # | 1 | 2 | 3 | 4 | 5 |
| k= | 2.7624E+00 | 2.7650E−01 | 9.0903E−01 | −4.7608E−01 | −5.3756E−01 |
| A4= | 9.8994E−05 | −7.0533E−04 | −1.3888E−05 | 1.6069E−04 | 4.1987E−04 |
| A6= | 1.7283E−05 | −1.0856E−05 | 1.0224E−04 | 5.8150E−06 | −7.8327E−05 |
| A8= | −2.4142E−06 | −9.5119E−06 | −5.9078E−06 | 5.7601E−06 | 1.2788E−05 |
| A10= | 1.1040E−07 | −1.0021E−07 | 3.2759E−06 | 2.2503E−07 | −1.7115E−06 |

| Surface # | 6 | 8 | 9 | 10 | 11 |
|---|---|---|---|---|---|
| k= | −2.5878E+00 | 3.8820E+00 | −3.2864E+00 | −3.5622E+00 | 3.3595E+01 |
| A4= | −3.9565E−04 | −1.9906E−02 | −5.1073E−03 | −7.9787E−04 | −5.8316E−03 |
| A6= | 8.9570E−05 | 3.4579E−03 | 2.3155E−03 | 7.6914E−04 | 8.8615E−04 |
| A8= | −2.8403E−05 | −5.7024E−04 | −2.6075E−04 | 1.6727E−04 | −3.9289E−05 |
| A10= | 1.3379E−06 | 3.9433E−05 | 1.4222E−05 | −2.1853E−05 | 8.1950E−06 |

| Surface # | 12 | 13 | 14 | 15 |
|---|---|---|---|---|
| k= | 2.3987E+00 | 4.5894E−01 | −5.4318E+00 | −6.0232E−01 |
| A4= | −2.4176E−02 | −3.7826E−02 | −2.3004E−02 | −3.7079E−02 |
| A6= | −1.8414E−03 | 3.4932E−03 | 7.4650E−04 | 3.3858E−03 |
| A8= | 2.9275E−04 | −8.2686E−04 | 8.4957E−04 | 1.0389E−04 |
| A10= | −1.0560E−04 | 1.5947E−04 | −1.5533E−04 | −4.8198E−05 |
| A12= | 1.8131E−05 | −1.5647E−05 | 1.1378E−05 | 3.6992E−06 |
| A14= | −9.6336E−07 | 6.0943E−07 | −3.2688E−07 | −1.0987E−07 |

In the 6th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 6th embodiment, so an explanation in this regard will not be provided again.

Moreover, these parameters can be calculated from Table 11 and Table 12 as the following values and satisfy the following conditions:

| 6th Embodiment | | | |
|---|---|---|---|
| f [mm] | 5.65 | R12/R14 | 1.11 |
| Fno | 1.85 | \|f/R1\| | 0.70 |
| HFOV [deg.] | 27.9 | f/R14 | 1.65 |
| CRA(Ymax) | 16.08 | Yc62/f | 0.28 |
| T23/CT2 | 0.17 | \|f/f6\| + \|f/f7\| | 0.43 |
| (CT6 + CT7)/T67 | 3.42 | f45 | −23.59 |
| ΣCT/Td | 0.60 | \|ff/fr\| | −0.27 |
| SDmax/SDmin | 1.84 | | |

7th Embodiment

Figure 13:
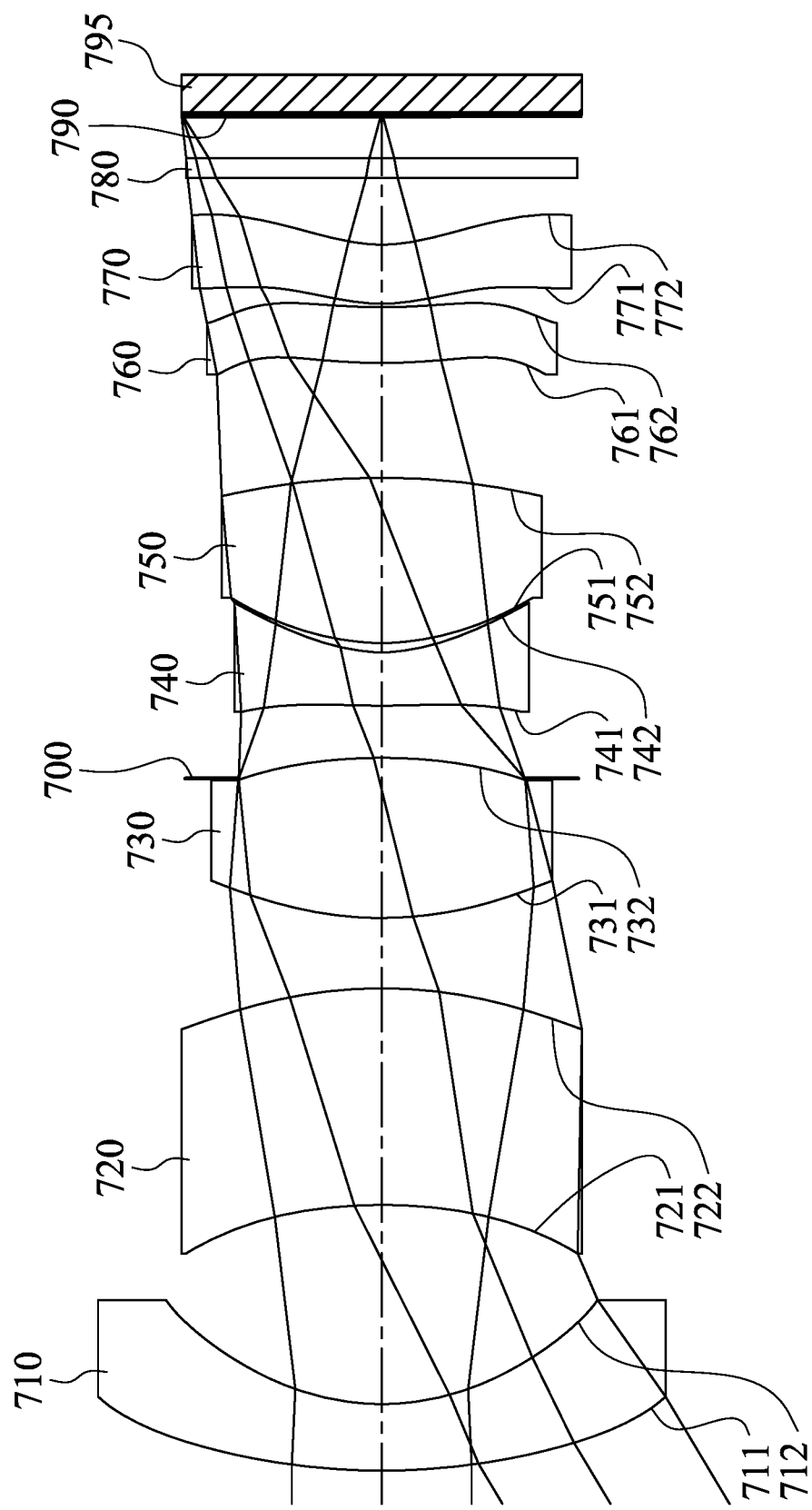
FIG. 13 is a schematic view of an image capturing device according to the 7th embodiment of the present disclosure.
Figure 14:
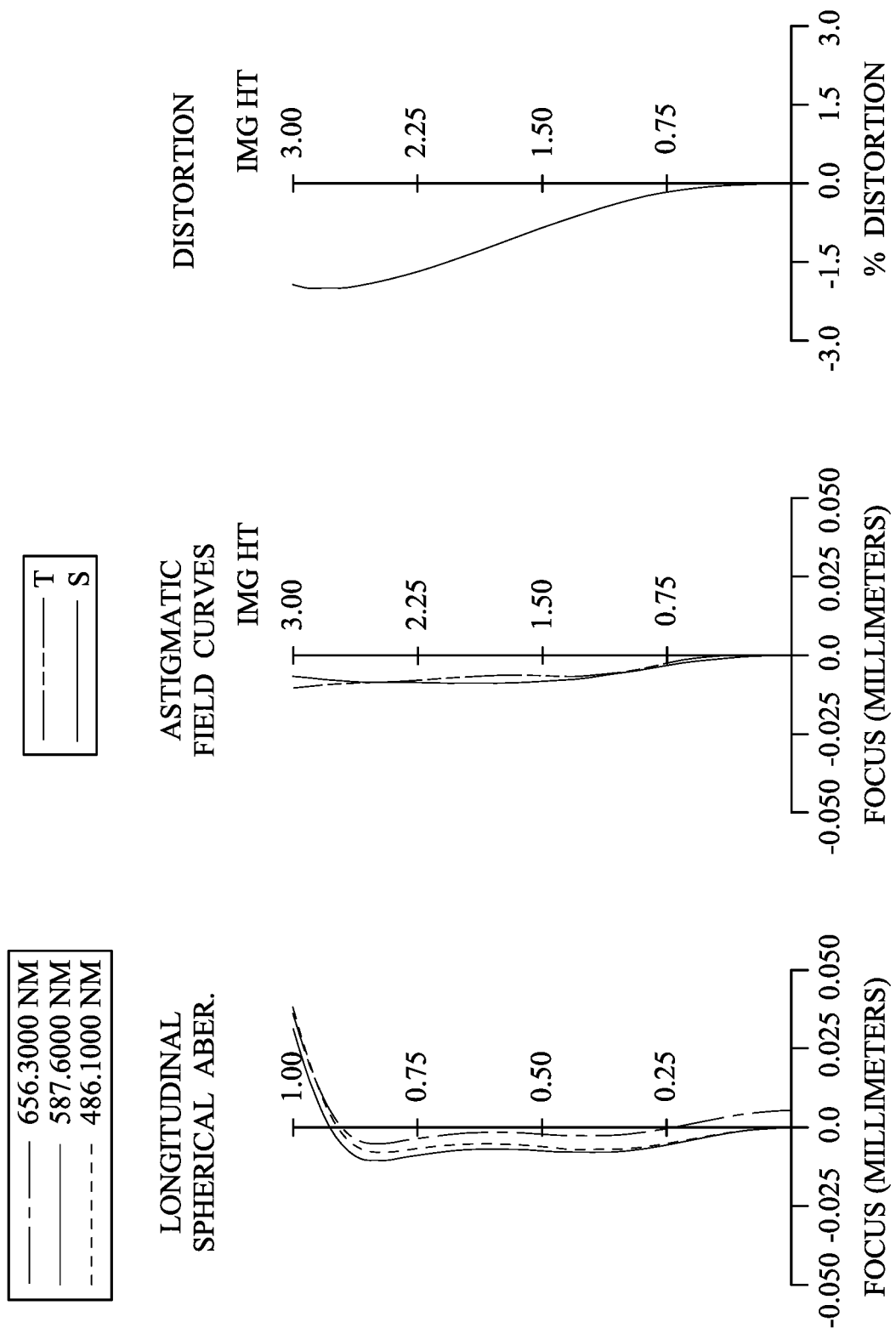
FIG. 14 shows spherical aberration curves, astigmatic field curves and a distortion curve of the image capturing device according to the 7th embodiment.

FIG. 13 is a schematic view of an image capturing device according to the 7th embodiment of the present disclosure. FIG. 14 shows spherical aberration curves, astigmatic field curves and a distortion curve of the image capturing device according to the 7th embodiment. In FIG. 13, the image capturing device includes an optical image capturing system (its reference numeral is omitted) and an image sensor 795. The optical image capturing system includes, in order from an object side to an image side, a first lens element 710, a second lens element 720, a third lens element 730, an aperture stop 700, a fourth lens element 740, a fifth lens element 750, a sixth lens element 760, a seventh lens element 770, an IR-cut filter 780 and an image surface 790, wherein the image sensor 795 is disposed on the image surface 790 of the optical image capturing system. The optical image capturing system has a total of seventh lens elements (710-770) with refractive power. There is no relative movement among the lens elements (710-770) with refractive power.

The first lens element 710 with negative refractive power has an object-side surface 711 being convex in a paraxial region thereof and an image-side surface 712 being concave in a paraxial region thereof. The first lens element 710 is made of plastic material, and has the object-side surface 711 and the image-side surface 712 being both aspheric.

The second lens element 720 with positive refractive power has an object-side surface 721 being concave in a paraxial region thereof and an image-side surface 722 being convex in a paraxial region thereof. The second lens element 720 is made of plastic material, and has the object-side surface 721 and the image-side surface 722 being both aspheric.

The third lens element 730 with positive refractive power has an object-side surface 731 being convex in a paraxial region thereof and an image-side surface 732 being convex in a paraxial region thereof. The third lens element 730 is made of plastic material, and has the object-side surface 731 and the image-side surface 732 being both aspheric.

The fourth lens element 740 with negative refractive power has an object-side surface 741 being convex in a paraxial region thereof and an image-side surface 742 being concave in a paraxial region thereof. The fourth lens element 740 is made of plastic material, and has the object-side surface 741 and the image-side surface 742 being both aspheric.

The fifth lens element 750 with positive refractive power has an object-side surface 751 being convex in a paraxial region thereof and an image-side surface 752 being convex in a paraxial region thereof. The fifth lens element 750 is made of plastic material, and has the object-side surface 751 and the image-side surface 752 being both aspheric.

The sixth lens element 760 with positive refractive power has an object-side surface 761 being convex in a paraxial region thereof, and an image-side surface 762 being concave in a paraxial region thereof and including at least one convex shape in an off-axial region thereof. The sixth lens element 760 is made of plastic material, and has the object-side surface 761 and the image-side surface 762 being both aspheric.

The seventh lens element 770 with negative refractive power has an object-side surface 771 being convex in a paraxial region thereof and including at least one concave shape in an off-axial region thereof, and an image-side surface 772 being concave in a paraxial region thereof and including at least one convex shape in an off-axial region thereof. The seventh lens element 770 is made of plastic material, and has the object-side surface 771 and the image-side surface 772 being both aspheric.

The IR-cut filter 780 is made of glass material and located between the seventh lens element 770 and the image surface 790, and will not affect a focal length of the optical image capturing system.

The detailed optical data of the 7th embodiment are shown in Table 13 and the aspheric surface data are shown in Table 14 below.

TABLE 13

7th Embodiment
f = 5.13 mm, Fno = 1.90, HFOV = 30.8 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Lens 1 | 10.105 | ASP | 1.000 | Plastic | 1.530 | 55.8 | −11.93 |
| 2 | | 3.756 | ASP | 2.991 | | | | |
| 3 | Lens 2 | −8.092 | ASP | 3.254 | Plastic | 1.639 | 23.5 | 43.87 |
| 4 | | −7.264 | ASP | 1.059 | | | | |
| 5 | Lens 3 | 5.670 | ASP | 2.405 | Plastic | 1.544 | 55.9 | 6.55 |
| 6 | | −8.174 | ASP | −0.310 | | | | |
| 7 | Ape. Stop | Plano | | 1.094 | | | | |
| 8 | Lens 4 | 14.601 | ASP | 0.800 | Plastic | 1.639 | 23.5 | −4.53 |
| 9 | | 2.366 | ASP | 0.141 | | | | |
| 10 | Lens 5 | 3.516 | ASP | 2.479 | Plastic | 1.544 | 55.9 | 5.43 |
| 11 | | −13.979 | ASP | 1.729 | | | | |
| 12 | Lens 6 | 9.349 | ASP | 0.837 | Plastic | 1.544 | 55.9 | 512.86 |
| 13 | | 9.368 | ASP | 0.055 | | | | |
| 14 | Lens 7 | 2.901 | ASP | 0.886 | Plastic | 1.544 | 55.9 | −106.69 |
| 15 | | 2.466 | ASP | 1.000 | | | | |
| 16 | IR-cut filter | Plano | | 0.300 | Glass | 1.517 | 64.2 | — |
| 17 | | Plano | | 0.651 | | | | |
| 18 | Image | Plano | | — | | | | |

Note:
Reference wavelength is 587.6 nm (d-line).

TABLE 14

Aspheric Coefficients

| Surface # | 1 | 2 | 3 | 4 | 5 |
|---|---|---|---|---|---|
| k= | 3.4890E+00 | 1.4337E−01 | 4.7516E+00 | 1.8182E−01 | −7.0172E−01 |
| A4= | −5.8202E−04 | −1.8150E−03 | −1.1464E−03 | −1.8667E−04 | 7.1658E−05 |
| A6= | −1.7751E−06 | −1.0954E−04 | 1.8406E−05 | 4.9024E−05 | −5.1612E−05 |
| A8= | −1.6208E−07 | −1.0477E−05 | −8.3274E−06 | 3.3486E−07 | 4.0968E−06 |
| A10= | 4.7185E−08 | −5.0536E−09 | 2.2411E−06 | 3.1282E−07 | −1.8407E−06 |

| Surface # | 6 | 8 | 9 | 10 | 11 |
|---|---|---|---|---|---|
| k= | 2.4920E+00 | −4.4675E+01 | −3.4984E+00 | −2.9888E+00 | −8.5636E+00 |
| A4= | −1.4624E−03 | −1.9480E−02 | −4.1534E−03 | −8.0500E−04 | −5.6254E−03 |
| A6= | 7.1064E−05 | 3.0001E−03 | 1.1575E−03 | 5.7401E−04 | 5.3667E−04 |
| A8= | −1.2440E−05 | −3.8059E−04 | −1.9334E−05 | 8.4830E−05 | 1.3975E−05 |
| A10= | 6.2432E−07 | 2.7214E−05 | −6.8603E−06 | −1.5474E−05 | −1.1252E−06 |

| Surface # | 12 | 13 | 14 | 15 |
|---|---|---|---|---|
| k= | 6.4837E+00 | 9.8209E+00 | −3.5716E+00 | −9.0513E−01 |
| A4= | 3.9750E−03 | −1.7180E−03 | −2.7046E−02 | −4.4989E−02 |
| A6= | −8.1801E−03 | −8.7975E−03 | 5.8595E−04 | 7.2715E−03 |
| A8= | 1.8143E−03 | 2.0929E−03 | 8.2891E−04 | −8.3594E−04 |
| A10= | −3.3514E−04 | −2.8224E−04 | −1.6423E−04 | 5.3510E−05 |
| A12= | 3.8429E−05 | 2.1950E−05 | 1.3225E−05 | −1.9589E−06 |
| A14= | −1.6331E−06 | −6.6810E−07 | −3.7007E−07 | 4.9281E−08 |

In the 7th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 7th embodiment, so an explanation in this regard will not be provided again.

Moreover, these parameters can be calculated from Table 13 and Table 14 as the following values and satisfy the following conditions:

| 7th Embodiment | | | |
|---|---|---|---|
| f [mm] | 5.13 | R12/R14 | 3.80 |
| Fno | 1.90 | |f/R1| | 0.51 |
| HFOV [deg.] | 30.8 | f/R14 | 2.08 |
| CRA(Ymax) | 17.78 | Yc62/f | 0.27 |
| T23/CT2 | 0.33 | |f/f6| + |f/f7| | 0.06 |
| (CT6 + CT7)/T67 | 31.33 | f45 | −47.81 |
| ΣCT/Td | 0.63 | |ff/fr| | 0.15 |
| SDmax/SDmin | 2.02 | | |

8th Embodiment

Figure 17:
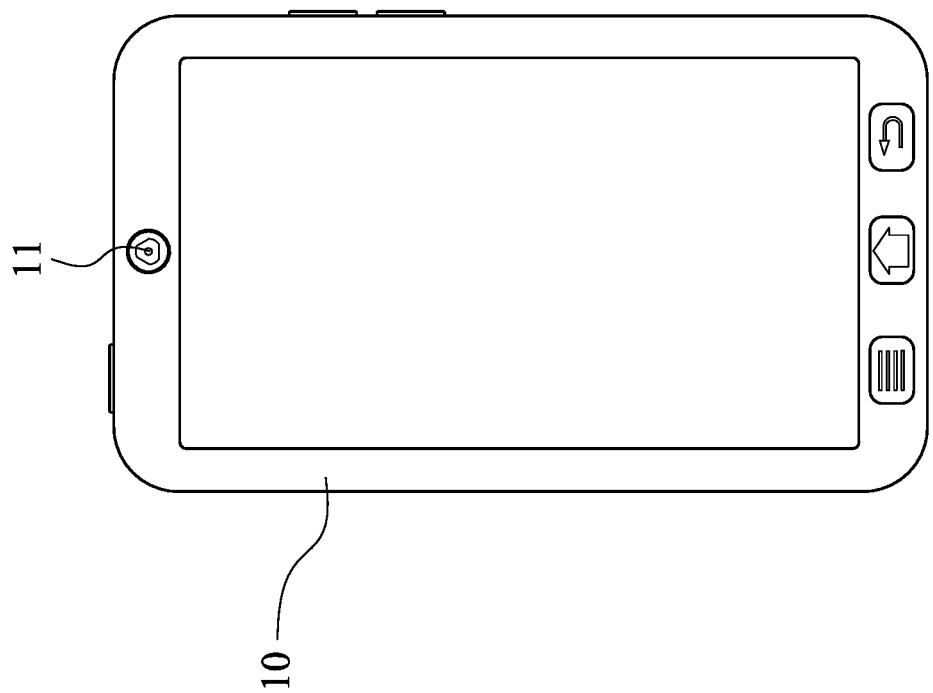
FIG. 17 is a schematic view of an electronic device according to the 8th embodiment of the present disclosure.

FIG. 17 is a schematic view of an electronic device 10 according to the 8th embodiment of the present disclosure. The electronic device 10 of the 8th embodiment is a smart phone, wherein the electronic device 10 includes an image capturing device 11. The image capturing device 11 includes an optical image capturing system (its reference numeral is omitted) according to the present disclosure and an image sensor (its reference numeral is omitted), wherein the image sensor is disposed on an image surface of the optical image capturing system.

9th Embodiment

Figure 18:
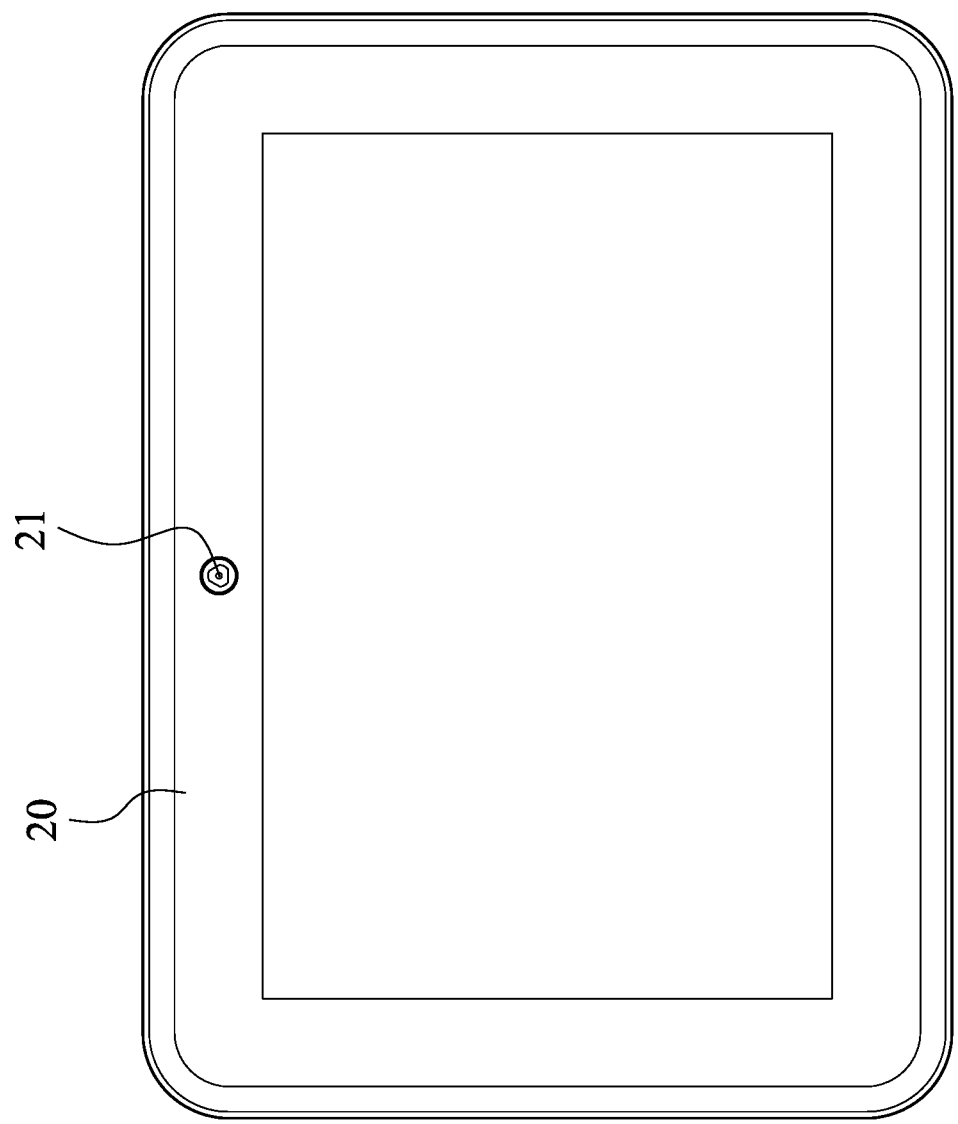
FIG. 18 is a schematic view of an electronic device according to the 9th embodiment of the present disclosure.

FIG. 18 is a schematic view of an electronic device 20 according to the 9th embodiment of the present disclosure. The electronic device 20 of the 9th embodiment is a tablet personal computer, wherein the electronic device 20 includes an image capturing device 21. The image capturing device 21 includes an optical image capturing system (its reference numeral is omitted) according to the present disclosure and an image sensor (its reference numeral is omitted), wherein the image sensor is disposed on an image surface of the optical image capturing system.

10th Embodiment

Figure 19:
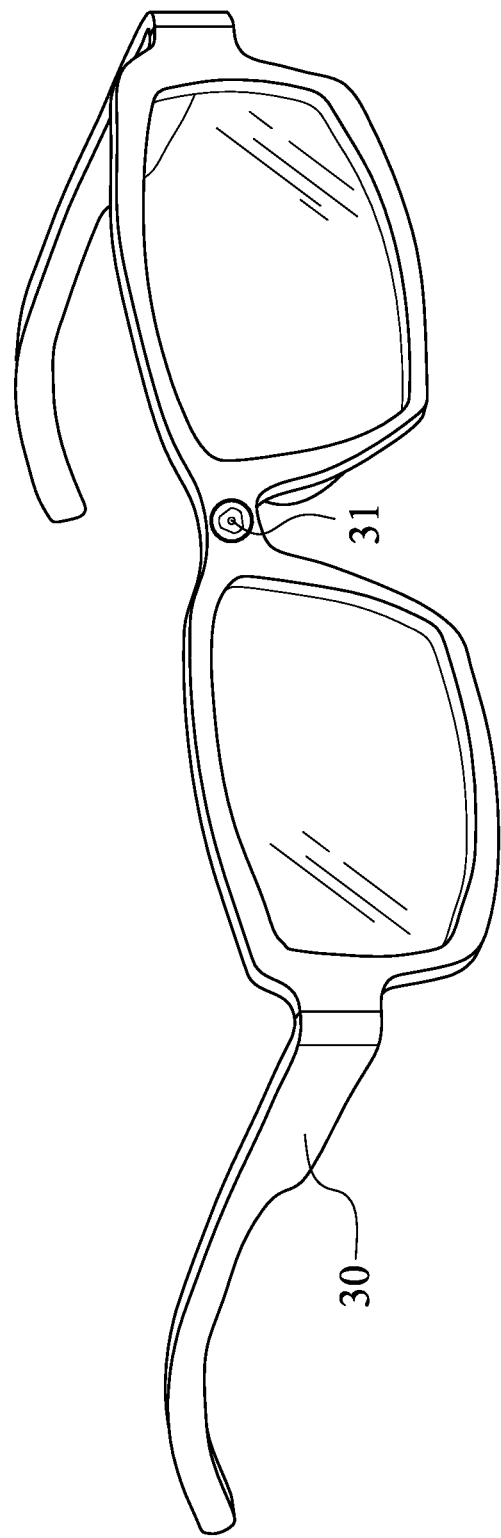
FIG. 19 is a schematic view of an electronic device according to the 10th embodiment of the present disclosure.

FIG. 19 is a schematic view of an electronic device 30 according to the 10th embodiment of the present disclosure. The electronic device 30 of the 10th embodiment is a wearable device, wherein the electronic device 30 includes an image capturing device 31. The image capturing device 31 includes an optical image capturing system (its reference numeral is omitted) according to the present disclosure and an image sensor (its reference numeral is omitted), wherein the image sensor is disposed on an image surface of the optical image capturing system.

11th Embodiment

Figure 20:
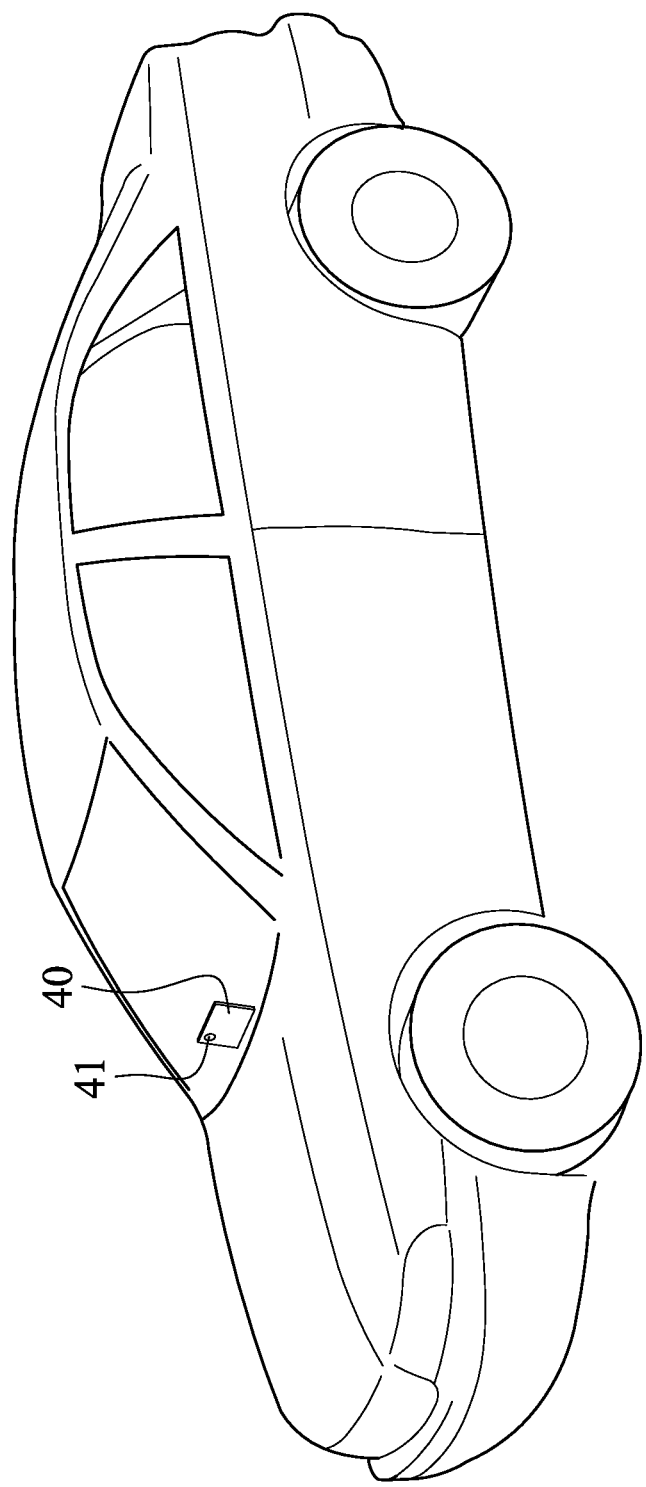
FIG. 20 is a schematic view of a vehicle device according to the 11th embodiment of the present disclosure.

FIG. 20 is a schematic view of a vehicle device 40 according to the 11th embodiment of the present disclosure. The vehicle device 40 of the 11th embodiment is a driving recording system, wherein the vehicle device 40 includes an image capturing device 41. The image capturing device 41 includes an optical image capturing system (its reference numeral is omitted) according to the present disclosure and an image sensor (its reference numeral is omitted), wherein the image sensor is disposed on an image surface of the optical image capturing system.

The foregoing description, for purpose of explanation, has been described with reference to specific embodiments. It is to be noted that TABLES 1-14 show different data of the different embodiments; however, the data of the different embodiments are obtained from experiments. The embodiments were chosen and described in order to best explain the principles of the disclosure and its practical applications, to thereby enable others skilled in the art to best utilize the disclosure and various embodiments with various modifications as are suited to the particular use contemplated. The embodiments depicted above and the appended drawings are exemplary and are not intended to be exhaustive or to limit the scope of the present disclosure to the precise forms disclosed. Many modifications and variations are possible in view of the above teachings.

What is claimed is:

1. An optical image capturing system comprising seven lens elements, the seven lens elements being, in order from an object side to an image side:
   a first lens element, a second lens element, a third lens element, a fourth lens element, a fifth lens element, a sixth lens element, and a seventh lens element; each of the seven lens elements having an object-side surface facing towards the object side and an image-side surface facing towards the image side;
   wherein the first lens element has negative refractive power;
   the fifth lens element has positive refractive power;
   the sixth lens element has negative refractive power;
   the image-side surface of the seventh lens element is concave in a paraxial region thereof, the image-side surface of the seventh lens element comprises at least one convex shape in an off-axis region thereof;
   wherein a total number of lens elements in the optical image capturing system is seven; a central thickness of the fifth lens element is a maximum among central thicknesses of the first lens element, the second lens element, the third lens element, the fourth lens element, the fifth lens element, the sixth lens element and the seventh lens element.

2. The optical image capturing system of claim 1, wherein the object-side surface of the fourth lens element is concave in a paraxial region thereof; the image-side surface of the fifth lens element is convex in a paraxial region thereof.

3. The optical image capturing system of claim 1, wherein a sum of the central thicknesses of the first lens element, the second lens element, the third lens element, the fourth lens element, the fifth lens element, the sixth lens element and the seventh lens element is ΣCT, an axial distance between the object-side surface of the first lens element and the image-side surface of the seventh lens element is Td, and the following condition is satisfied:

$$0.55 < \Sigma CT/Td \leq 0.68.$$

4. The optical image capturing system of claim 1, wherein an absolute value of a curvature radius of the object-side surface of the second lens element is greater than an absolute value of a curvature radius of the image-side surface of the fifth lens element.

5. The optical image capturing system of claim 1, wherein the central thickness of the second lens element is greater than an axial distance between the fifth lens element and the sixth lens element.

6. The optical image capturing system of claim 1, wherein a curvature radius of the object-side surface of the sixth lens element and a curvature radius of the image-side surface of the sixth lens element have the same sign.

7. The optical image capturing system of claim 1, further comprising:
an aperture stop located between the third lens element and the fourth lens element.

* * * * *